(12) United States Patent
Bauman et al.

(10) Patent No.: US 6,381,715 B1
(45) Date of Patent: Apr. 30, 2002

(54) SYSTEM AND METHOD FOR PERFORMING PARALLEL INITIALIZATION AND TESTING OF MULTIPLE MEMORY BANKS AND INTERFACES IN A SHARED MEMORY MODULE

(75) Inventors: Mitchell A. Bauman, Circle Pines; Roger L. Gilbertson; Eugene A. Rodi, both of Minneapolis, all of MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/223,850

(22) Filed: Dec. 31, 1998

(51) Int. Cl.[7] .............................................. G11C 29/00

(52) U.S. Cl. ...................... 714/718; 714/743; 365/201

(58) Field of Search ........................ 714/718, 46, 719, 714/36, 740–744, 763, 732, 728, 739, 720, 711, 10, 30, 5; 365/201, 233, 185.22, 185.3, 185.33, 218, 200; 375/362, 356; 711/3, 118, 209, 204, 103, 101; 370/474; 712/218, 23

(56) References Cited

U.S. PATENT DOCUMENTS

| | | | | |
|---|---|---|---|---|
| 4,322,846 A | * | 3/1982 | Carroll et al. ................ | 714/76 |
| 4,429,389 A | * | 1/1984 | Catiller ...................... | 714/718 |
| 5,331,643 A | * | 7/1994 | Smith ........................ | 714/728 |
| 5,442,640 A | * | 8/1995 | Bardell Jr. et al. ......... | 714/718 |
| 5,617,531 A | * | 4/1997 | Crouch et al. ............... | 714/30 |
| 5,859,804 A | * | 1/1999 | Hedberg et al. ............. | 365/201 |
| 6,182,253 B1 | * | 1/2001 | Lawrence et al. .......... | 714/718 |

OTHER PUBLICATIONS

Glaser, U. et al. (Logic optimization by an improved sequential redundancy addition and removal technique; IEEE; Design Automation Conference, 1995; Sep. 1, 1995).*

Mazumder, P (An efficient design of embedded memories and their testability analysis using Markov chains; IEEE; Wafer Scale Integration, 1989, Proceedings; Jan. 5, 1989).*

(List continued on next page.)

*Primary Examiner*—Albert Decady
*Assistant Examiner*—Guy Lamarre
(74) *Attorney, Agent, or Firm*—Charles A. Johnson; Mark T. Starr; Altera Law Group

(57) ABSTRACT

A system and method for testing and initializing a memory including multiple memory banks or a memory module partitioned into logical memory units. A plurality of memory exerciser testers are provided, one for each of the plurality of memory banks. Each of the memory exerciser testers includes an address generator to generate a sequence of memory bank addresses to successively address each of the memory banks in a cyclic manner, while each of the address generators concurrently addresses a different one of the memory banks. A data pattern generator is coupled to a corresponding one of the address generators to receive a data pattern control signal upon each output of each of the memory bank addresses generated by its corresponding address generator. The data pattern generator outputs a unique data pattern to the memory bank identified by the memory bank address in response to each occurrence of the data pattern control signal. A plurality of address initialization registers are provided, one for each of the plurality of exerciser testers. Each of the address initialization registers stores an initial memory bank address for one of the memory banks such that each of the address generators is preset to initially address a different one of the memory banks. In this manner, each memory bank is addressed by a different one of the address generators at any given time, which provides for concurrent testing of all memory banks and memory interfaces.

27 Claims, 13 Drawing Sheets

OTHER PUBLICATIONS

Adams, R.D. et al.(A 370–NHz memory built–in self–test state machine; IEEE; European Design and test Conference, 1995; Mar. 9, 1995).*

Bardell, P.H et al.(Built–in test for RAMs; IEEE Design & Test of Computers; IEEE, Aug. 1988).*

Thomas, R. et al. (Synthesis of fully testable sequential machines; Design Automation. EDAC., Proceedings of the European Conference; Feb. 28, 1991).*

Vinnakota, B. et al.(Self–intializing memory elements; IEEE, Jul. 1995).*

* cited by examiner

MEMORY CLUSTER (MCL)

DATA CROSSBAR (MDA)

MEMORY CONTROLLER (MCA)

| ADDRESS ↓1200 | TARGETED BUS ↓1202 | INCREMENT ↓1204 |
|---|---|---|
| 0 0 | AB0 | 5 |
| 0 1 | AB1 | 5 |
| 1 0 | AB2 | 5 |
| 1 1 | AB3 | 1 |

FIG. 12

| EXERCISER-0 (1300) | | | EXERCISER-1 (1302) | | | EXERCISER-2 (1304) | | | EXERCISER-3 (1306) | | |
|---|---|---|---|---|---|---|---|---|---|---|---|
| ADDRESS | BUS | + | ADDRESS | BUS | + | ADDRESS | BUS | + | ADDRESS | BUS | + |
| 0000 0000 | AB0 | +5 | 0000 0001 | AB1 | +5 | 0000 0010 | AB2 | +5 | 0000 0011 | AB3 | +1 |
| 0000 0101 | AB1 | +5 | 0000 0110 | AB2 | +5 | 0000 0111 | AB3 | +1 | 0000 0100 | AB0 | +5 |
| 0000 1010 | AB2 | +5 | 0000 1011 | AB3 | +1 | 0000 1000 | AB0 | +5 | 0000 1001 | AB1 | +5 |
| 0000 1111 | AB3 | +1 | 0000 1100 | AB0 | +5 | 0000 1101 | AB1 | +5 | 0000 1110 | AB2 | +5 |
| 0001 0000 | AB0 | +5 | 0001 0001 | AB1 | +5 | 0001 0010 | AB2 | +5 | 0001 0011 | AB3 | +1 |
| 0001 0101 | AB1 | +5 | 0001 0110 | AB2 | +5 | 0001 0111 | AB3 | +1 | 0001 0100 | AB0 | +5 |
| 0001 1010 | AB2 | +5 | 0001 1011 | AB3 | +1 | 0001 1000 | AB0 | +5 | 0001 1001 | AB1 | +5 |
| 0001 1111 | AB3 | +1 | 0001 1100 | AB0 | +5 | 0001 1101 | AB1 | +5 | 0001 1110 | AB2 | +5 |
| 0010 0000 | AB0 | +5 | 0010 0001 | AB1 | +5 | 0010 0010 | AB2 | +5 | 0010 0011 | AB3 | +1 |
| 0010 0101 | AB1 | +5 | 0010 0110 | AB2 | +5 | 0010 0111 | AB3 | +1 | 0010 0100 | AB0 | +5 |
| • | • | • | • | • | • | • | • | • | • | • | • |
| • | • | • | • | • | • | • | • | • | • | • | • |
| • | • | • | • | • | • | • | • | • | • | • | • |

FIG. 13

SYSTEM AND METHOD FOR PERFORMING PARALLEL INITIALIZATION AND TESTING OF MULTIPLE MEMORY BANKS AND INTERFACES IN A SHARED MEMORY MODULE

CROSS-REFERENCE TO OTHER PATENT APPLICATIONS

The following co-pending patent applications of common assignee contains some common disclosure:

"High-Performance Modular Memory System With Crossbar Connections", filed Dec. 31, 1997, Ser. No. 09/001,592, which is incorporated herein by reference in its entirety; and "Programmable Address Translation System", filed Dec. 31, 1997, Ser. No. 09/001,390, which is incorporated herein by reference in its entirety.

FIELD OF THE INVENTION

This invention relates generally to shared memory systems for use in multiprocessing systems, and more particularly to a system and method for initializing and testing all interfaces and memory in a data processing system having multiple memory banks or a memory module partitioned into logical memory units.

BACKGROUND OF THE INVENTION

Large-scale data processing systems typically utilize a tremendous amount of memory. This is particularly true in multiprocessing systems where multiple processing units are implemented. There are several memory methodologies known in the art that provide for efficient use of memory in such multiprocessing environments. One such memory methodology is a distributed memory where each processor has access to its own dedicated memory, and access to another processor's memory involves sending messages via an inter-processor network. While distributed memory structures avoid problems of contention for memory and can be implemented relatively inexpensively, it is usually slower than other memory methodologies, such as shared memory systems.

Shared memory is used in a parallel system, or multiprocessing, system, and can be accessed by more than one processor. The shared memory is connected to the multiple processing units—typically accomplished using a shared bus or network. Large-scale shared memories may be designed to cooperate with local cache memories associated with each processor in the system. Cache consistency, or coherency, protocols ensure that one processor's cached copy of a shared memory location is invalidated when another processor writes to that location.

In order to effectively and efficiently utilize shared memory systems, it may be desirable to configure the shared memory in a predetermined manner prior to use. For example, many shared memory systems employ memory partitioning for executing certain tasks. Generally, a memory partition is a contiguous area of memory within which tasks are loaded and executed, and memory partitioning is the act of designating such memory partitions. A partition includes predetermined characteristics such as a name, a defined size, and a starting address. Where shared memory systems associated with multiprocessing systems are very large, a great deal of overhead may be associated with such memory partitioning. It would therefore be desirable to provide for partitioning the shared memory in the most efficient and timely manner possible.

The data storage in such memory systems should also be capable of initialization to a predetermined state when desired, such as upon initial power application. Other memory locations may also require initialization, such as a directory storage area. Directory storage is used in directory-based cache coherency systems to store cache line state information. A cache line is a predetermined-size data packet that is transferred between the cache memory and the main, shared memory. Extremely large memories can include a correspondingly large volume of cache line storage, which must be tracked by the directory storage. Again, a great deal of time may be consumed during the initialization stage in a computing environment, and it would be desirable to provide a manner of efficiently initializing the shared memory system.

In order to ensure proper operation of the multiprocessing system, testing of the memory to locate and identify faulty memory locations is critical. A faulty storage location can have devastating effects on the operation of the system, particularly where data, executable programs, cache directory structures and the like, are all ultimately reliant on properly functioning memory. However, as is true for initialization functions, pre-processing functions such as memory testing for large-scale memory systems creates additional overhead, causing undesirable start-up delays.

The aggregate effect of performing various types of partitioning, initializing and testing in computer systems having tremendous storage capability is an undesirably lengthy initialization phase. Further, prior art systems typically perform a fixed initialization or testing function without affording flexibility to perform more specific or ad hoc test functions that were not thought of at the time at which fixed test functions were originally established.

It would therefore be desirable to provide an efficient system and method for initializing and testing extensive memory systems, in order to reduce pre-processing operation delays. The present invention provides a high performance mechanism and method for cooperatively testing and initializing a shared memory system having multiple memory banks, and provides flexibility to later afford an opportunity to include newly-created test functions. The present invention therefore provides a solution to shortcomings of the prior art, and offers numerous other advantages over the prior art.

SUMMARY OF THE INVENTION

The present invention provides a system and method for testing and initializing a memory including multiple memory banks or a memory module partitioned into logical memory units. Testing in accordance with the present invention provides for parallel test activities for testing data storage, directory storage, and address and data interfaces.

In accordance with another embodiment of the invention, a memory test and initialization circuit for testing and initializing the memory and memory interfaces in a data processing system is provided. The memory is physically divided into separate memory banks, or alternatively is divided into a plurality of logical memory units. The circuit includes a plurality of exerciser testers, one for each of the plurality of memory banks. Each of the exerciser testers includes an address generator to generate a sequence of memory bank addresses to successively address each of the memory banks in a cyclic manner. Therefore, each address generator addresses a first memory bank, followed by a second memory bank and so forth until each memory bank has been addressed, at which time the address generator again addresses the first memory bank. Each of the address generators in the test and initialization circuit performs this type of cyclic memory bank addressing, however each of the address generators concurrently addresses a different one of the memory banks. A data pattern generator is coupled to a corresponding one of the address generators to receive a data pattern control signal upon each output of each of the memory bank addresses generated by its corresponding address generator. The data pattern generator outputs a unique data pattern to the memory bank identified by the memory bank address in response to each occurrence of the data pattern control signal. In one embodiment, the data pattern generated is an incrementing data pattern, where the increment occurs each time the memory bank address changes. The circuit also includes a plurality of address initialization registers, one for each of the plurality of exerciser testers. Each of the address initialization registers stores an initial memory bank address for one of the memory banks. In this manner, each of the address generators is preset to initially address a different one of the memory banks, and each address generator addresses each memory bank in a cyclical fashion. Therefore, each memory bank is addressed by a different one of the address generators at any given time, which provides for concurrent testing of all memory banks and memory interfaces.

In accordance with another embodiment of the invention, a method for performing test and initialization of a memory having a plurality of memory banks is provided. The method includes concurrently generating a plurality of memory bank addresses from a plurality of address generators, wherein each of the concurrently generated memory bank addresses targets a different one of the plurality of memory banks. The memory bank addresses are provided from each of the address generators to each of the plurality of memory banks in a cyclical fashion. An incrementing data pattern is generated for each of the memory bank addresses targeting a particular one of the memory banks, wherein each of the data patterns is written to the memory bank addressed by its corresponding memory bank address. The data patterns are subsequently read back from the plurality of memory banks in the same sequence in which the data patterns were written to the plurality of memory banks. The data patterns read back from the memory banks are then compared to expected data patterns to verify memory and memory interface performance. In more specific embodiments of the invention, the initialization process includes additional initialization steps for initializing SDRAM memory, including initializing hardware registers to a predetermined logic state, precharging each of the SDRAM memory banks, performing a memory refresh operation on each of the SDRAM memory banks, and programming each of the SDRAM memory banks to conform to a desired mode of operation.

Still other objects and advantages of the present invention will become readily apparent to those skilled in this art from the following detailed description. As will be realized, the invention is capable of other and different embodiments, and its details are capable of modification without departing from the scope and spirit of the invention. Accordingly, the drawing and description are to be regarded as illustrative in nature, and not as restrictive.

BRIEF DESCRIPTION OF THE DRAWINGS

The invention is described in connection with the embodiments illustrated in the following diagrams.

FIG. 12 illustrates the variable incrementation function of an Increment Control module used to assist in the generation of cache line addresses in accordance with the present invention;

FIG. 13 illustrates the cache line address pattern generated by the Increment Control and Counter in each of the Exerciser Testers.

DETAILED DESCRIPTION OF THE ILLUSTRATED EMBODIMENTS

The present invention provides a system and method for testing and initializing a data processing system having multiple memory banks or a memory module partitioned into logical memory units. Testing in accordance with the present invention allows parallel test activities which test data storage, directory storage, and address and data interfaces. A unique addressing scheme is employed to provide address interleaving to test each memory interface. Multiple modes of testing are available to provide testing flexibility, and to account for potential system errors affecting even the initialization procedure.

Figure 1:
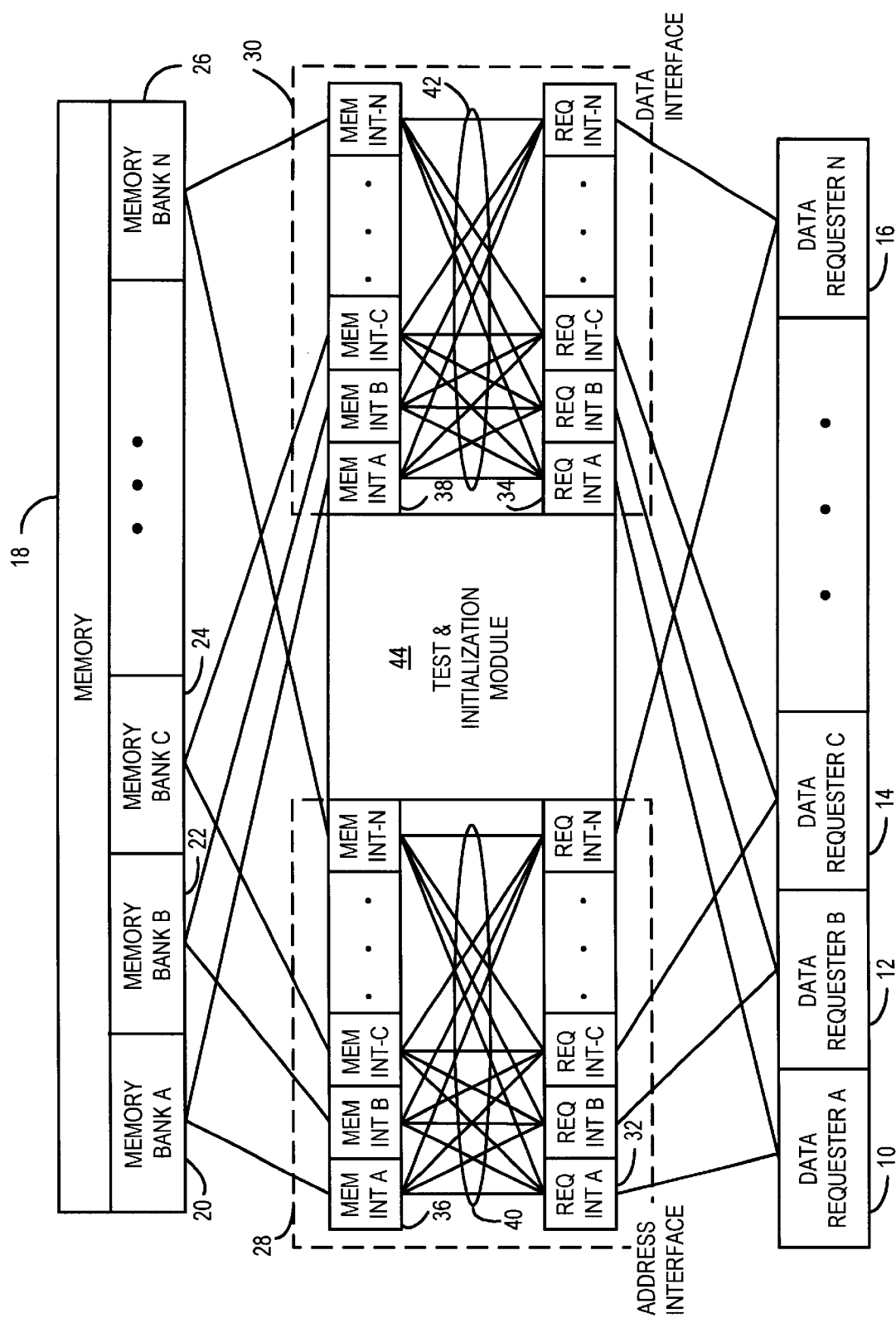
FIG. 1 is block diagram of a multiprocessor system having multiple memory banks in which the principles of the present invention may be employed.

FIG. 1 is block diagram of a multiprocessor system having multiple memory banks in which the principles of the present invention may be employed. In this embodiment, a plurality of data transfer requesters, labeled Data Requester A 10, Data Requester B 12, Data Requester C 14 through Data Requester n 16 represent entities capable of initiating data transfer requests. These data transfer requests, such as data fetch and data store requests, initiate data transfers between the Data Requesters and the Memory 18. The Memory 18 may be divided into multiple memory banks, such as Memory Bank A 20, Memory Bank B 22, Memory Bank C 24 through Memory Bank n 26. An Address Interface 28 provides the addresses designated by the data transfer request between the appropriate Memory Bank and Data Requester. The Data Interface 30 distributes the data identified for transfer by the data transfer request between the Memory Bank and the Data Requesters.

The system of FIG. 1 includes a plurality of Request Interfaces and Memory Interfaces for both the Address Interface 28 and the Data Interface 30. Each Data Requester is coupled to a Request Interface in the Address and Data Interfaces 28, 30. For example, Data Requester A 10 is coupled to Request Interface A 32 of the Address Interface 28, and to the Request Interface A 34 of the Data Interface 30. Each Data Requester is similarly coupled to corresponding Request Interfaces. A plurality of Memory Interfaces are also provided for both the Address Interface 28 and the Data Interface 30. Each Memory Bank is coupled to a Memory Interface in the Address and Data Interfaces 28, 30. For example, Memory Bank A 20 is coupled to Memory Interface A 36 of the Address Interface 28, and to the Memory Interface A 38 of the Data Interface 30. Each Memory Bank is similarly coupled to corresponding Memory Interfaces.

Addresses are transferred from Request Interfaces in the Address Interface 28 to targeted Memory Banks via corresponding Memory Interfaces, as illustrated by Interface Paths 40. Data is transferred from Request Interfaces in the Data Interface 30 to the addressed Memory Banks via corresponding Memory Interfaces, as illustrated by Interface Paths 42. This data processing arrangement allows for multiple data transfers to occur concurrently.

Testing and initialization of such a system can be complex, and can prove to be quite time-consuming. Where the Memory 18 is very large, writing and verifying test patterns can require an undesirable amount of time. Further, in such a system where a large number of internal interfaces (e.g., Interface Paths 40, 42) are utilized under normal operating conditions, they should be thoroughly tested to ensure proper operation. The Test & Initialization Module 44 performs such testing and initialization.

In order to fully understand the present invention, an example data processing system in which the present invention may be implemented is described below. It is within this context that the present invention is described. Therefore, while the present invention is particularly advantageous in the context of a Symmetrical Multi-Processor (SMP) environment as described below, it will be appreciated by those skilled in the art that the invention is equally applicable to other computing environments requiring management of memory, I/O, or other transaction processing requests. Therefore, the SMP environment described in FIGS. 2–8 is provided for illustrative purposes and to provide a full operational understanding of the invention; however the invention is not limited thereto.

Figure 2:
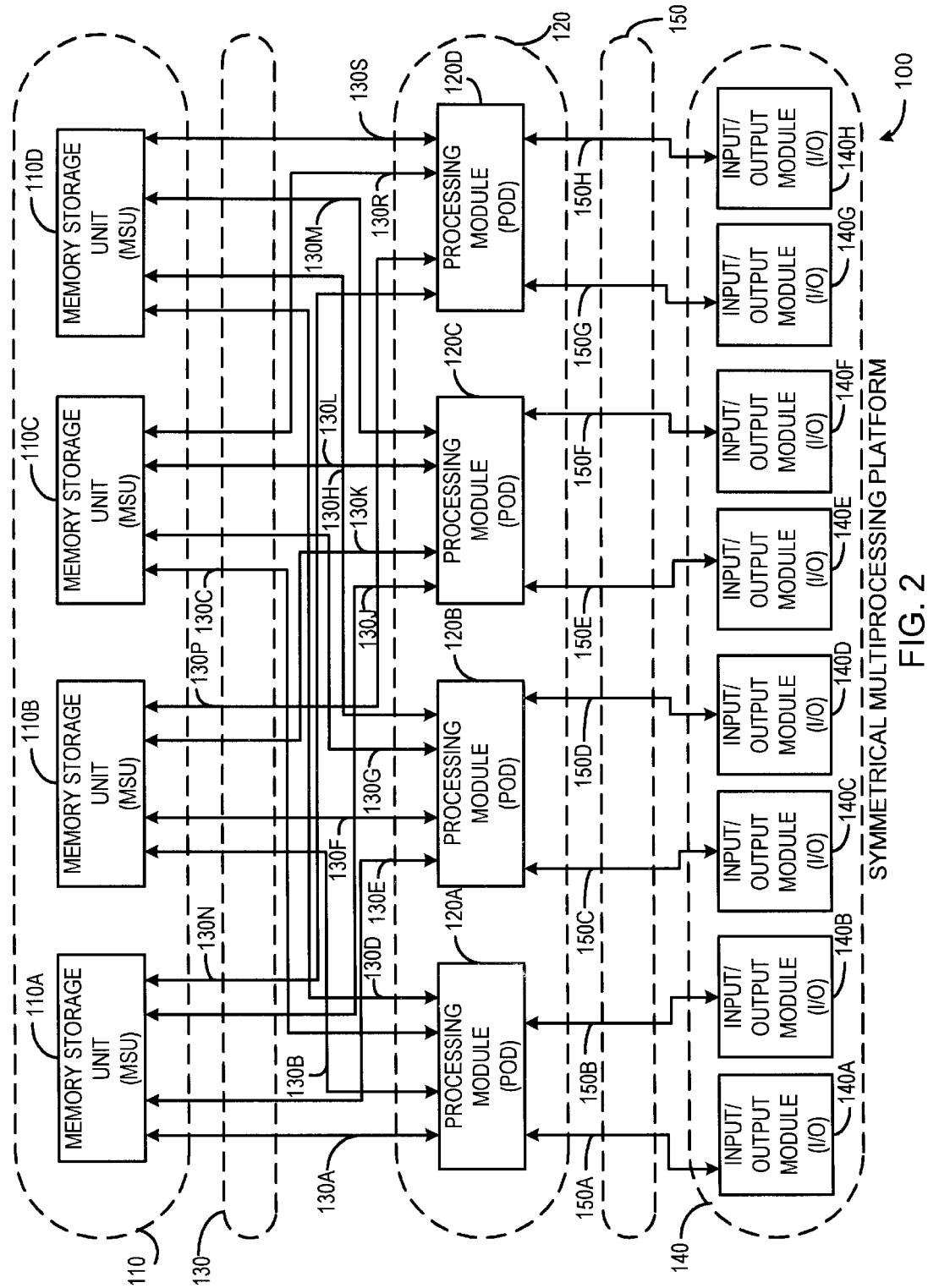
FIG. 2 is a block diagram of a Symmetrical Multi-Processor (SMP) System Platform in which the principles of the present invention may be applied.

FIG. 2 is a block diagram of a Symmetrical Multi-Processor (SMP) System Platform in which the principles of the present invention may be applied. System Platform 100 includes one or more Memory Storage Units (MSUs) in dashed block 110 individually shown as MSU 110A, MSU 110B, MSU 110C and MSU 110D, and one or more Processing Modules (PODs) in dashed block 120 individually shown as POD 120A, POD 120B, POD 120C, and POD 120D. Each unit in MSU 110 is interfaced to all PODs 120A, 120B, 120C, and 120D via a dedicated, point-to-point connection referred to as an MSU Interface (MI) in dashed block 130, individually shown as 130A through 130S. For example, MI 130A interfaces POD 120A to MSU 110A, MI 130B interfaces POD 120A to MSU 110B, MI 130C interfaces POD 120A to MSU 110C, MI 130D interfaces POD 120A to MSU 110D, and so on.

In this example SMP environment, MI 130 comprises separate bi-directional data and bi-directional address/command interconnections, and further includes unidirectional control lines that control the operation on the data and address/command interconnections (not individually shown). The control lines operate at a system clock frequency (SYSCLK) while the data bus runs source synchronous at two times the system clock frequency (2×SYSCLK). For example, in one embodiment, the system clock frequency is approximately 100 megahertz (MHZ).

Any POD 120 has direct access to data in any MSU 110 via one of MIs 130. For example, MI 130A allows POD 120A direct access to MSU 110A and MI 130F allows POD 120B direct access to MSU 110B. PODs 120 and MSUs 110 are discussed in further detail below.

System Platform 100 further comprises Input/Output (I/O) Modules in dashed block 140 individually shown as I/O Modules 140A through 140H, which provide the interface between various Input/Output devices and one of the PODs 120. Each I/O Module 140 is connected to one of the PODs across a dedicated point-to-point connection called the MIO Interface in dashed block 150 individually shown as 150A through 150H. For example, I/O Module 140A is connected to POD 120A via a dedicated point-to-point MIO Interface 150A. The MIO Interfaces 150 are similar to the MI Interfaces 130, but may have a transfer rate that is approximately half the transfer rate of the MI Interfaces because the I/O Modules 140 are located at a greater distance from the PODs 120 than are the MSUs 110.

Figure 3:
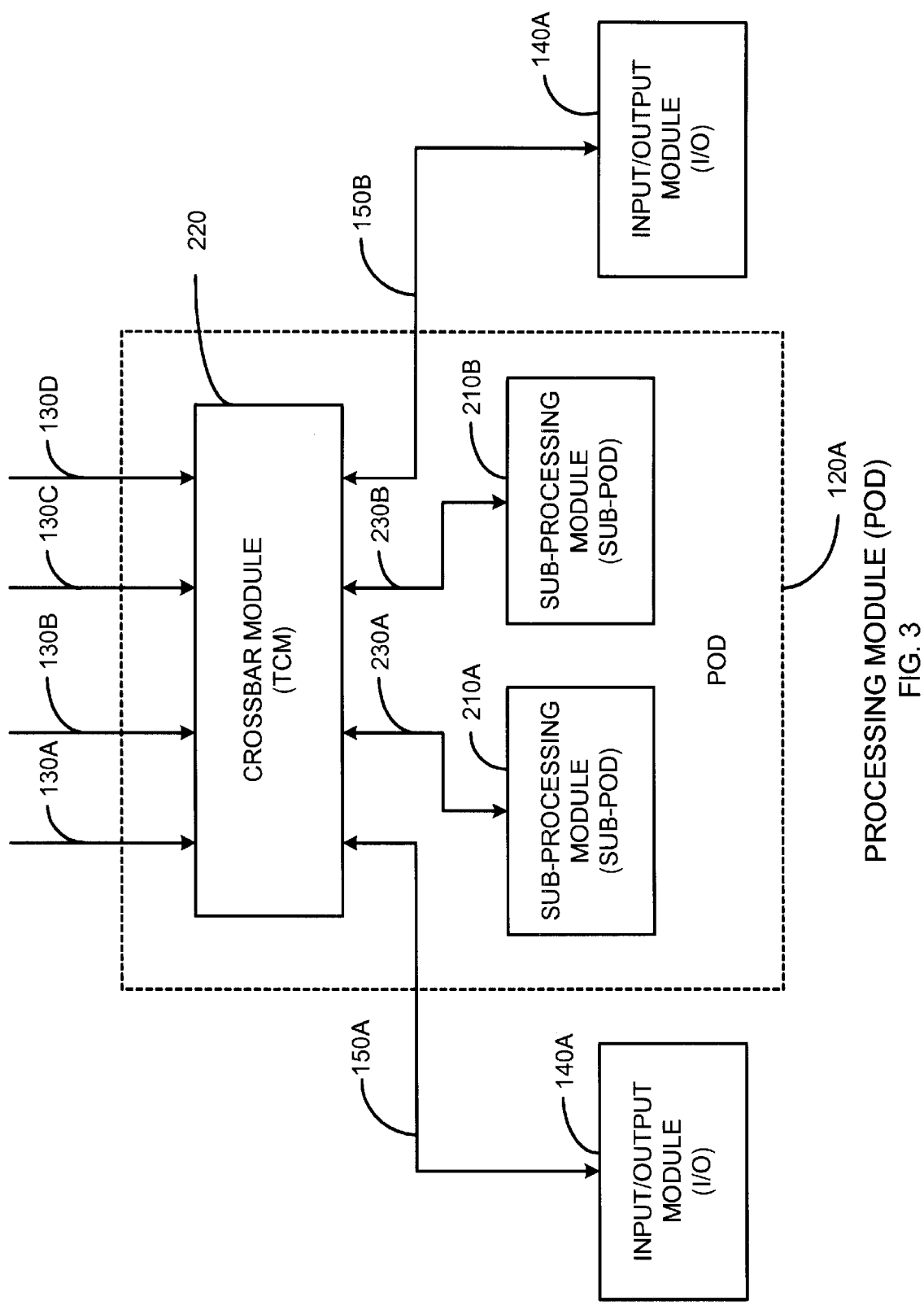
FIG. 3 is a block diagram of one embodiment of a processing module (POD) of a representative SMP.

FIG. 3 is a block diagram of one embodiment of a processing module (POD). POD 120A is shown, but each of the PODs 120A through 120D have a similar configuration. POD 120A includes two Sub-Processing Modules (Sub-PODs) 210A and 210B. Each of the Sub-PODs 210A and 210B are interconnected to a Crossbar Module (TCM) 220 through dedicated point-to-point Interfaces 230A and 230B, respectively, that are similar to the MI interconnections 130. TCM 220 further interconnects to one or more I/O Modules 140 via the respective point-to-point MIO Interfaces 150. TCM 220 both buffers data and functions as a switch between Interfaces 230A, 230B, 150A, and 150B, and MI Interfaces 130A through 130D. When an I/O Module 140 or a Sub-POD 210 is interconnected to one of the MSUs via the TCM 220, the MSU connection is determined by the address provided by the I/O Module or the Sub-POD, respectively. In general, the TCM maps one-fourth of the memory address space to each of the MSUs 110A–110D. The TCM 220 can further be configured to perform address interleaving functions to the various MSUs. The TCM may also be utilized to perform address translation functions that are necessary for ensuring that each processor (not shown in FIG. 3) within each of the Sub-PODs 210 and each I/O Module 140 views memory as existing within a contiguous address space as is required by certain off-the-shelf operating systems.

Figure 4:
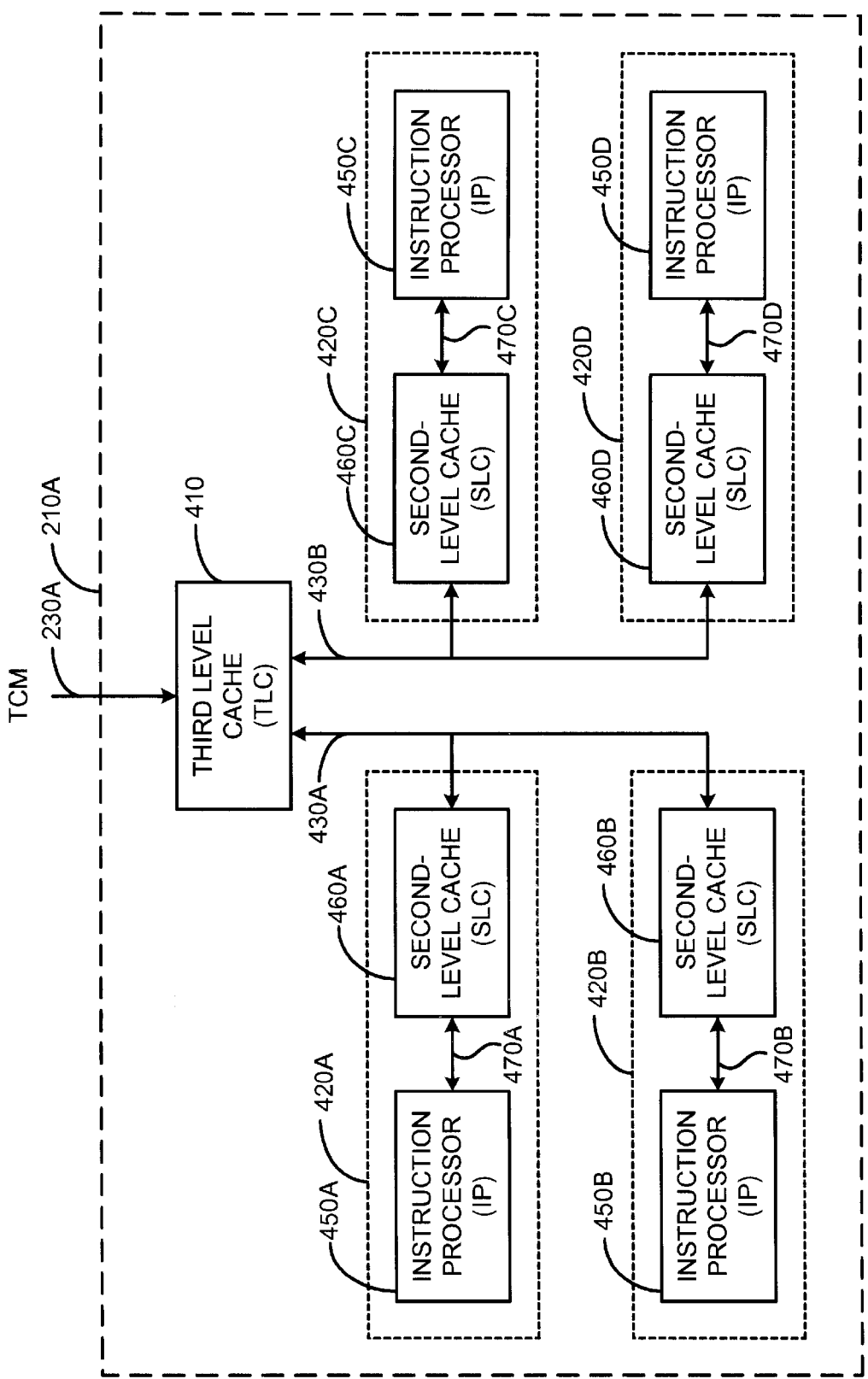
FIG. 4 is a block diagram of one example of a Sub-Processing Module (Sub-POD) of the representative SMP.

FIG. 4 is a block diagram of one example of a Sub-Processing Module (Sub-POD) 210A. Sub-POD 210A is shown, but it is understood that all Sub-PODs 210 have similar structures and interconnections. In this embodiment, Sub-POD 210A includes a Third-Level Cache (TLC) 410 and one or more Coherency Domains 420 (shown as Coherency Domains 420A, 420B, 420C, and 420D). TLC 410 is connected to Coherency Domains 420A and 420B via Bus 430A, and is connected to Coherency Domains 420C and 420D via Bus 430B. TLC 410 caches data from the MSU, and maintains data coherency among all of Coherency Domains 420, guaranteeing that each processor is always operating on the latest copy of the data.

Each Coherency Domain 420 includes an Instruction Processor (IP) 450 (shown as IPs 450A, 450B, 450C, and 450D), and a Second-Level Cache (SLC) 460 (shown as SLC 460A, 460B, 460C and 460D.) Each SLC interfaces to an IP via a respective point-to-point Interface 470 (shown as Interfaces 470A, 470B, 470C, and 470D), and each SLC further interfaces to the TLC via Bus 430 (shown as 430A and 430B.) For example, SLC 460A interfaces to IP 450A via Interface 470A and to TCL 410 via Bus 430A. Similarly, SLC 460C interfaces to IP 450C via Interface 470C and to TCL 410 via Bus 430B. Each SLC caches data from the TLC as requested by the interconnecting IP 450.

IP 450 and SLC 460 may be integrated in a single device, such as, for example, a Pentium Pro® Processing device available from the Intel Corporation. Alternatively, the IP 450 may be a A-Series Instruction Processor or a 2200-Series Instruction Processor, both commercially available from the Unisys Corporation. In this embodiment, the IP 450 is externally coupled to an SLC 460.

In a preferred arrangement, IP 450 includes an internal First Level Cache. Many commercially-available processing devices include an internal FLC as well as an SLC. Alternatively, IPs 450 may each utilize an external FLC or not include an FLC at all. Furthermore, in other embodiments, each Coherency Domain 420 may includes more successive levels of cache so that multiple caches exist between TLC 410 and IP 450.

Figure 5:
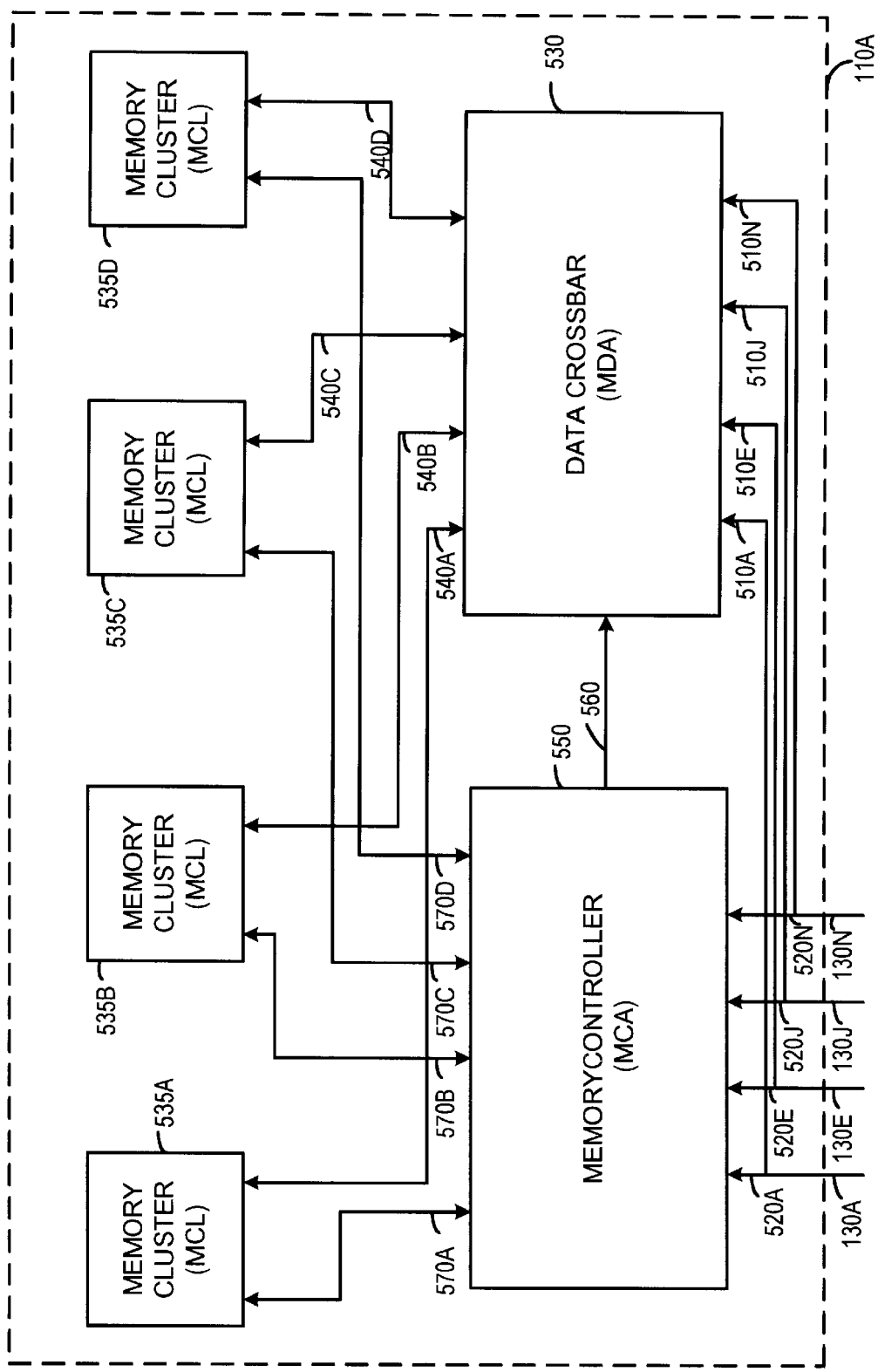
FIG. 5 is a block diagram of a Memory Storage Unit (MSU) of the representative SMP.

FIG. 5 is a block diagram of a Memory Storage Unit (MSU) 110. Although MSU 110A is shown and discussed, it is understood that this discussion applies equally to each of the MSUs 110. As discussed above, MSU 110A interfaces to each of the PODs 120A, 120B, 120C, and 120D across dedicated point-to-point MI Interfaces 130A, 130E, 130J, and 130N, respectively. Each MI Interface 130 contains Data Lines 510 (shown as 510A, 510E, 510J, and 510N) wherein each set of Data Lines 510 includes sixty-four bi-directional data bits, data parity bits, data strobe lines, and error signals (not individually shown.) Each set of Data Lines 510 is therefore capable of transferring eight bytes of data at one time. In addition, each MI Interface 130 includes bi-directional Address/command Lines 520 (shown as 520A, 520E, 520J, and 520N.) Each set of Address/command Lines 520 includes bi-directional address signals, a response signal, hold lines, address parity, and early warning and request/arbitrate lines.

A first set of unidirectional control lines from a POD to the MSU are associated with each set of the Data Lines 510, and a second set of unidirectional control lines from the MSU to each of the PODs are further associated with the Address/command Lines 520. Because the Data Lines 510 and the Address/command Lines 520 each are associated with individual control lines, the Data and Address information may be transferred across the MI Interfaces 130 in a split transaction mode. In other words, the Data Lines 510 and the Address/command Lines 520 are not transmitted in a lock-step manner.

The transfer rates of the Data Lines 510 and Address/control Lines 520 may be different, such as where the data is transferred across the Data Lines at rate of approximately 200 Mega-Transfers per Second (MT/S), and the address/command information is transferred across the Address/command Lines at approximately 100 MT/S. During a typical data transfer, the address/command information is conveyed in two transfers, whereas the associated data is transferred in a sixty-four-byte packet called a cache line that requires eight transfers to complete.

Returning now to a discussion of FIG. 5, the Data Lines 510A, 510E, 510J, and 510N interface to the Memory Data Crossbar (MDA) 530. The MDA 530 buffers data received on Data Lines 510, and provides the switching mechanism that routes this data between the PODs 120 and an addressed one of the storage sub-units called Memory Clusters (MCLs) 535 (shown as 535A, 535B, 535C, and 535D.) Besides buffering data to be transferred from any one of the PODs to any one of the MCLs, the MDA 530 also buffers data to be transferred from any one of the PODs to any other one of the PODs (or even to itself to transfer data to a different Sub-POD) in a manner to be discussed further below. The MDA 530 can also receive data from any one of the MCLs 535 on each of Data Buses 540 for delivery to any one of the PODs 120.

The MDA 530 is capable of simultaneously receiving data from one or more of the MI Interfaces 130 while simultaneously providing data to all of the other MI Interfaces 130. Each of the MI Interfaces is capable of operating at a transfer rate of 64 bits every five nanoseconds (ns), or 1.6 gigabytes/second for a combined transfer rate across four interfaces of 6.4 gigabytes/second. The MDA 530 is further capable of transferring data to, or receiving data from, each of the MCLs 535 across Data Buses 540 at a rate of 128 bits every 10 ns per Data Bus 540, for a total combined transfer rate across all Data Buses 540 of 6.4 gigabytes/seconds. Data Buses 540 require twice as long to perform a single data transfer operation (10 ns versus 5 ns) as compared to Data Lines 510 because Data Buses 540 are longer and support multiple loads. It should be noted that since the MDA is capable of buffering data received from any of the MCLs and any of the PODs, up to eight unrelated data transfer operations may be occurring to and/or from the MDA at any given instant in time. Therefore, as mention above, the MDA is capable of routing data at a combined peak transfer rate of 12.8 gigabytes/second.

Control for the MDA 530 is provided by the Memory Controller (MCA) 550. MCA queues memory requests, and provides timing and routing control information to the MDA across Control Lines 560. The MCA 550 also buffers address, command and control information received on Address/command lines 520A, 520E, 520J, and 520N, and provides request addresses to the appropriate memory device across Address Lines 570 (shown as 570A, 570B, 570C, and 570D) in a manner to be described further below. For operations that require access to the MCLs 535, the address information determines which of the MCLs 535 will receive the memory request. The command information indicates which type of operation is being performed. Possible commands include Fetch, Flush, Return, I/O Overwrite, and Message Transfer. The control information provides timing and bus arbitration signals which are used by distributed state machines within the MCA 550 and the PODs 120 to control the transfer of data and address/commands between the PODs and the MSUs. The use of the address, command, and control information will be discussed further below.

The memory associated with MSU 110A is organized into up to four Memory Clusters (MCLs) shown as MCL 535A, MCL 535B, MCL 535C, and MCL 535D. However, the MSU may be populated with as few as one MCL if the user so desires. In one arrangement, each MCL includes arrays of Synchronous Dynamic Random Access memory (SDRAM) devices and associated drivers and transceivers. MCL 535A, 535B, 535C, and 535D is each serviced by one of the independent bi-directional Data Buses 540A, 540B, 540C, and 540D, respectively, where each of the Data Buses 540 includes 128 data bits. Each MCL 535A, 535B, 535C, and 535D is further serviced by one of the independent set of the Address Lines 570A, 570B, 570C, and 570D, respectively.

In one embodiment, an MCL 535 requires 20 clock cycles, or 200 ns, to complete a memory operation involving a cache line of data. In contrast, each of the Data Buses 540 are capable of transferring a 64-byte cache line of data to/from each of the MCLs 535 in five bus cycles, wherein each bus cycle corresponds to one clock cycle. This five-cycle transfer includes one bus cycle for each of the four sixteen-byte data transfer operations associated with a 64-byte cache line, plus an additional bus cycle to switch drivers on the bus. To resolve the discrepancy between the faster transfer rate of the Data Buses 540 and the slower access rate to the MCLs 535, the system is designed to allow four memory requests to be occurring simultaneously but in varying phases of completion to a single MCL 535. To allow this interlacing of requests to occur, each set of Address Lines 570 includes two address buses and independent control lines as discussed below in reference to FIG. 6.

Before discussing the memory structure in more detail, the data coherency scheme of the current system is discussed. Data coherency involves ensuring that each POD 120 operates on the latest copy of the data. Since multiple copies of the same data may exist within platform memory, including the copy in the MSU and additional copies in various local cache memories (local copies), some scheme is needed to control which data copy is considered the "latest" copy.

The platform of the current invention uses a directory protocol to maintain data coherency. In a directory protocol, information associated with the status of units of data is stored in memory. This information is monitored and updated by a controller when a unit of data is requested by one of the PODs 120. In one embodiment of the present invention, this information includes the status of each 64-byte cache line. The status is updated when access to a cache line is granted to one of the PODs. The status information includes a vector which indicates the identity of the POD(s) having local copies of the cache line.

In the platform of the present invention, the status of the cache line includes "shared" and "exclusive." Shared status means that one or more PODs have a local copy of the cache line for read-only purposes. A POD having shared access to a cache line may not update the cache line. Thus, for example, PODs 120A and 120B may have shared access to a cache line such that a copy of the cache line exists in the Third-Level Caches 410 of both PODs for read-only purposes.

In contrast to shared status, exclusive status, which is also referred to as exclusive ownership, indicates that only one POD "owns" the cache line. A POD must gain exclusive ownership of a cache line before data within the cache line may be modified. When a POD has exclusive ownership of a cache line, no other POD may have a copy of that cache line in any of its associated caches.

Before a POD can gain exclusive ownership of a cache line, any other PODs having copies of that cache line must complete any in-progress operations to that cache line. Then, if one or more POD(s) have shared access to the cache line, the POD(s) must designate their local copies of the cache line as invalid. This is known as a Purge operation. If, on the other hand, a single POD has exclusive ownership of the requested cache line, and the local copy has been modified, the local copy must be returned to the MSU before the new POD can gain exclusive ownership of the cache line. This is known as a "Return" operation, since the previous exclusive owner returns the cache line to the MSU so it can be provided to the requesting POD, which becomes the new exclusive owner. Both the Purge and Return operations are initiated by the MSU, since it contains and manages the directory. In addition, the updated cache line is written to the MSU sometime after the Return operation has been performed, and the directory state information is updated to reflect the new status of the cache line data. In the case of either a Purge or Return operation, the POD(s) having previous access rights to the data may no longer use the old local copy of the cache line, which is invalid. These POD(s) may only access the cache line after regaining access rights in the manner discussed above.

In addition to Return operations, PODs also provide data to be written back to an MSU during Flush operations as follows. When a POD receives a cache line from an MSU, and the cache line is to be copied to a cache that is already full, space must be allocated in the cache for the new data. This requires a mechanism to determine which older cache line(s) will be disposed of, or "aged out of" cache to provide the amount of space needed for the new information. If the older data has never been modified, it may be merely overwritten with the new data. However, if the older data has been modified, the cache line including this older data must be written back to the MSU 110 during a Flush Operation so that this latest copy of the data is preserved.

Data is also written to an MSU 110 during I/O Overwrite operations. An I/O Overwrite occurs when one of the I/O Modules 140 issues an I/O Overwrite command to the MSU. This causes data provided by the I/O Module to overwrite the addressed data in the MSU. The Overwrite operation is performed regardless of which other PODs have local copies of the data when the Overwrite operation is performed. The directory state information is updated to indicate that the affected cache line(s) is "Present" in the MSU, meaning the MSU has ownership of the cache line and no valid copies of the cache line exist anywhere else in the system.

In addition to having ownership following an Overwrite operation, the MSU is also said to have ownership of a cache line when the MSU has the most current copy of the data and no other agents have a valid local copy of the data. This could occur, for example, after a POD having exclusive data ownership performs a Flush operation of one or more cache lines so that the MSU thereafter has the only valid copy of the data.

Figure 6:
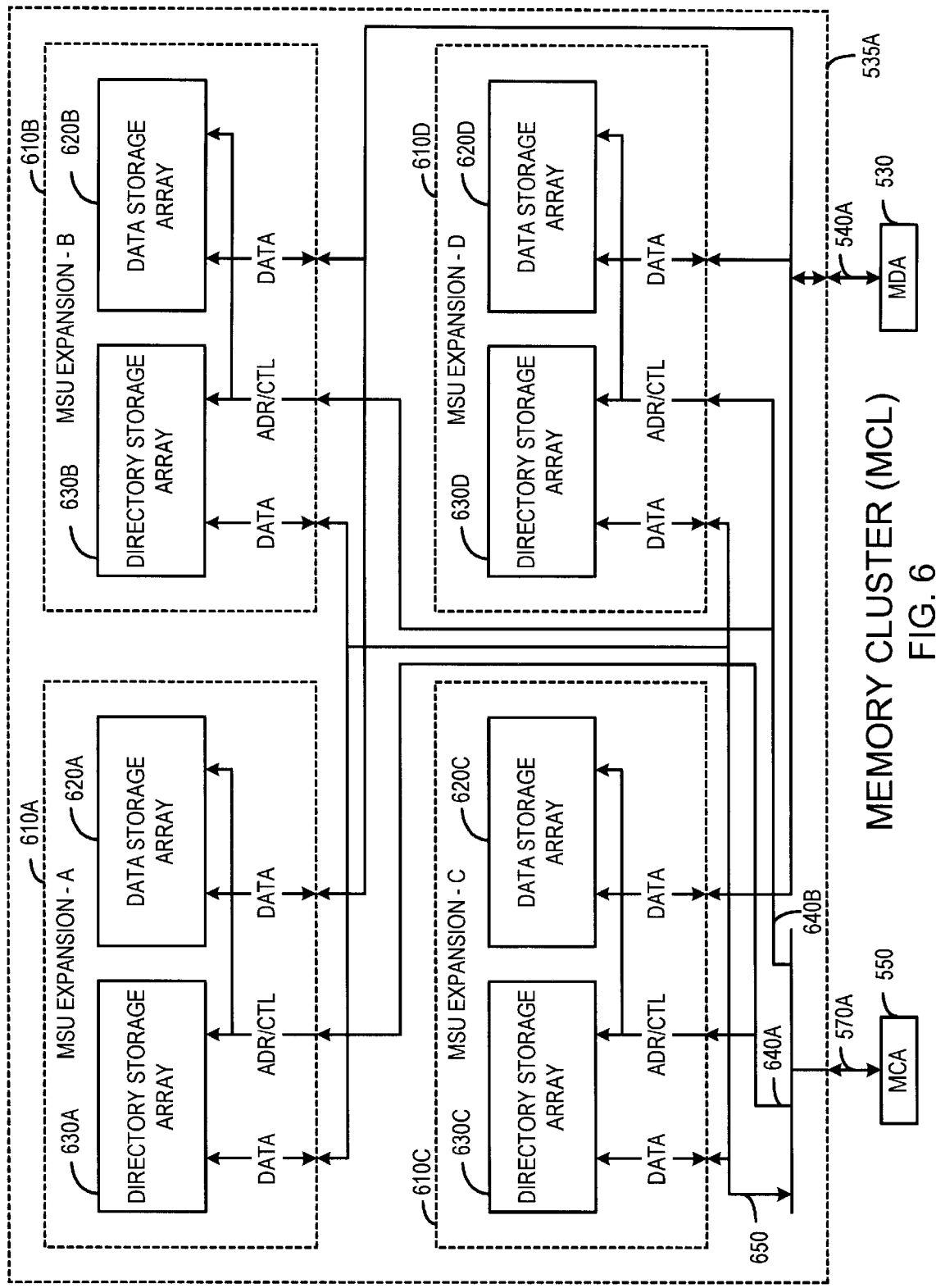
FIG. 6 is a block diagram of a Memory Cluster (MCL) of the representative SMP.

FIG. 6 is a block diagram of a Memory Cluster (MCL) 535A. Although MCL 535A is shown and described, the following discussion applies equally to all MCLs 535. An MCL contains between one and four MSU Expansions 610A, 610B, 610C, and 610D as dictated by user needs. A minimally-populated MSU 110 will contain at least one MSU Expansion 610. Each MSU Expansion 610 includes two Dual In-line Memory Modules (DIMMs, not individually shown). Since a fully populated MSU 110 includes up to four MCLs 535, and a fully populated MCL includes up to four MSU Expansions, a fully populated MSU 110 includes up to 16 MSU Expansions 610 and 32 DIMMs. The DIMMs can be populated with various sizes of commercially available SDRAMs as determined by user needs. In one embodiment, the DIMMs are populated with either 64 Mbyte, 128 Mbyte, or 256 Mbyte SDRAMs. Using the largest capacity DIMM, the MSU 110 has a maximum capacity of eight gigabytes of data storage, or 32 gigabytes of data storage in a SMP Platform 100 having four MSUs. Additional storage is provided for the directory state information, and parity and error bits to be discussed below.

Each MSU Expansion 610 contains two arrays of logical storage, Data Storage Array 620 (shown as 620A, 620B, 620C, and 620D) and Directory Storage Array 630 (shown as 630A, 630B, 630C, and 630D.) MSU Expansion 610A includes Data Storage Array 620A and Directory Storage Array 630A, and so on.

In one arrangement, each Data Storage Array 620 is 128 data bits wide, and accommodates 28 check bits, and four error bits (not individually shown.) This information is divided into four independent Error Detection and Correction (ECC) fields, each including 32 data bits, seven check bits, and an error bit. An ECC field provides Single Bit Error Correction (SBEC), Double Bit Error Detection (DED), and guarantees error detection within a field of any four adjacent data bits. Since each Data Storage Array 620 is composed of SDRAM devices which are each eight data bits wide, full device failure detection can be ensured by splitting the eight bits from each SDRAM device into separate ECC fields.

Each of the Data Storage Arrays 620 interfaces to the bi-directional Data Bus 540A which also interfaces with the MDA 530. Each of the Data Storage Arrays further receives selected ones of the uni-directional Address Lines 570A driven by the MCA 550. As discussed above, each of the Address Lines 570A includes two Address Buses 640 (shown as 640A and 640B), one for each pair of MSU Expansions 610. Data Storage Arrays 620A and 620C receive Address Bus 640A, and Data Storage Arrays 620B and 620D receive Address Bus 640B. This dual address bus structure allows multiple memory transfer operations to be occurring simultaneously to each of the Data Storage Arrays within an MCL 535, thereby allowing the slower memory access rates to more closely match the data transfer rates achieved on Data Buses 540. This will be discussed further below.

Each addressable storage location within the Directory Storage Arrays 630 contains nine bits of directory state information and five check bits for providing single-bit error correction and double-bit error detection on the directory state information. The directory state information includes the status bits used to maintain the directory coherency scheme discussed above. Each of the Directory Storage Arrays is coupled to one of the Address Buses 640 from the MCA 550. Directory Storage Arrays 630A and 630C are coupled to Address Bus 640A, and Directory Storage Arrays 630B and 630D are coupled to Address Bus 640B. Each of the Directory Storage Arrays further receive a bi-directional Directory Data Bus 650, which is included in Address Lines 570A, and which is used to read and update the directory state information.

The Data Storage Arrays 620 provide the main memory for the SMP Platform. During a read of one of the Data Storage Arrays 620 by one of the Sub-PODs 210 or one of the I/O modules 140, address signals and control lines are presented to a selected MSU Expansion 610 in the timing sequence required by the commercially-available SDRAMs populating the MSU Expansions. The particular MSU Expansion is selected based on the request address. After a fixed delay, the Data Storage Array 620 included within the selected MSU Expansion 610 provides the requested cache line during a series of four 128-bit data transfers, with one transfer occurring every 10 ns. After each of the transfers, each of the SDRAMs in the Data Storage Array 620 automatically increments the address internally in predetermined fashion. At the same time, the Directory Storage Array 630 included within the selected MSU Expansion 610 performs a read-modify-write operation. Directory state information associated with the addressed cache line is provided from the Directory Storage Array across the Directory Data Bus 650 to the MCA 550. The MCA updates the directory state information and writes it back to the Directory Storage Array in a manner to be discussed further below.

During a memory write operation, the MCA 550 drives Address Lines 640 to the one of the MSU Expansions 610 selected by the request address. The Address Lines are driven in the timing sequence required by the commercially-available SDRAMs populating the MSU Expansion 610. The MDA 530 then provides the 64 bytes of write data to the selected Data Storage Array 620 using the timing sequences required by the SDRAMs. Address incrementation occurs within the SDRAMs in a similar manner to that described above.

Figure 7:
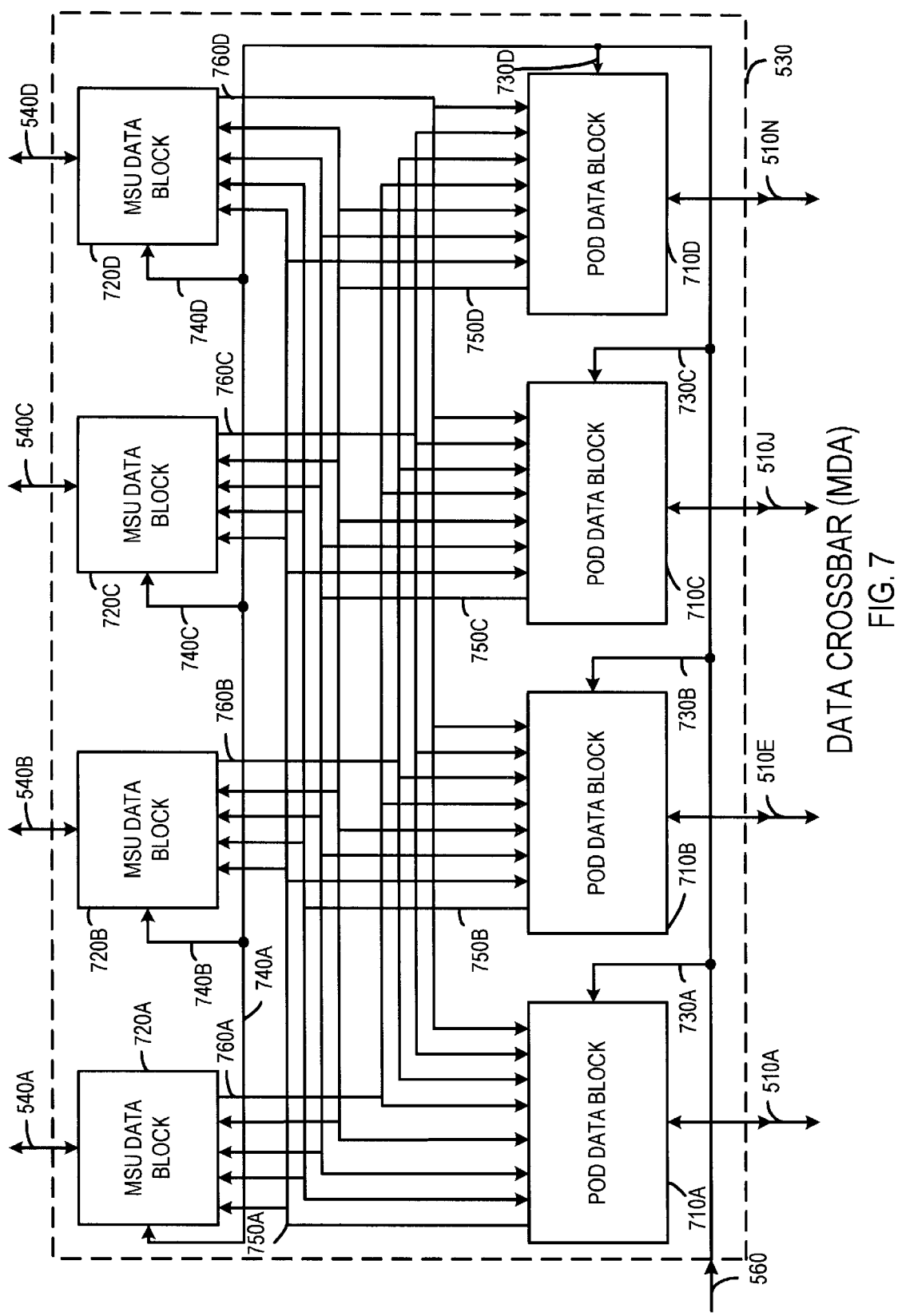
FIG. 7 is a block diagram of a Data Crossbar (MDA) in the representative SMP.

FIG. 7 is a block diagram of the Data Crossbar (MDA) 530. Although MDA 530 of MSU 110A is shown and discussed, this discussion applies equally to all MDAs 530 in the system. POD Data Blocks 710, shown as POD Data Blocks 710A, 710B, 710C, and 710D interface to PODs 120A, 120B, 120C, and 120D, respectively, over Data Lines 510A, 510E, 510J, and 510N, respectively. POD Data Blocks 710 buffer the data sent to, and received from, the respective one of the PODs 120. MDA 530 further includes MSU Data Blocks 720A, 720B, 720C, and 720D, which are interconnected to MCLs 535A, 535B, 535C, and 535D over Data Buses 540A, 540B, 540C, and 540D, respectively. MSU Data Blocks 720 buffer the data sent to, and received from, the respective MCL 535. The MCA 550 provides the control for the POD Data Blocks 710 and the MSU Data Blocks 720 on Control Line 560. Control Line 560 includes independent control lines to each of the POD Data Blocks 710 (shown as POD Data Block Control Lines 730A, 730B, 730C, and 730D) so that each POD Data Block 710 can run in parallel. Control line 560 further includes independent control lines to each of the MSU Data Blocks (shown as MSU Data Block Control Lines 740A, 740B, 740C, and 740D) so that each MSU Data Block 720 can run in parallel.

Each POD Data Block 710 drives all of the MSU Data Blocks 720 and all other POD Data Blocks 710 on Lines 750 (shown as 750A, 750B, 750C, and 750D) with two independent 128-bit sets of data signals (not individually shown). For example, POD Data Block 710A drives Line 750A, which includes two independent 128-bit sets of data signals that are each driven to each of the MSU Data Blocks 720, and to each of the other POD Data Blocks 710. Each of the independent 128-bit sets of data signals included in each of Lines 750 are unidirectional and are used to transfer updated memory data to a selected one of the MSU Data Blocks 720 during a Return, Flush, or I/O Overwrite Operation. Each of the sets of data signals on Lines 750 also transfers message data or an updated cache line from one POD 120 to an another POD during Message or Return Operations, respectively.

Each MSU Data Block 720 drives all of the POD Data Blocks 710 on Lines 760 (shown as 760A, 760B, 760C, and 760D). Each of Lines 760 include two independent 128-bit sets of data signals that drive each of the POD Data Blocks 710. For example, MSU Data Block 720A drives Line 760A, which includes two independent 128-bit sets of data signals that are each driven to each of the POD Data Blocks 710. Each of the independent 128-bit sets of data signals included in each of Lines 750 are unidirectional and are used to transfer data from the MCLs 535 to the PODs 120 during read operations when the directory state information associated with the addressed cache line indicates the cache line is "Present" in the MSU, indicating that the most recent copy of the data is owned by the MSU 110.

Figure 8:
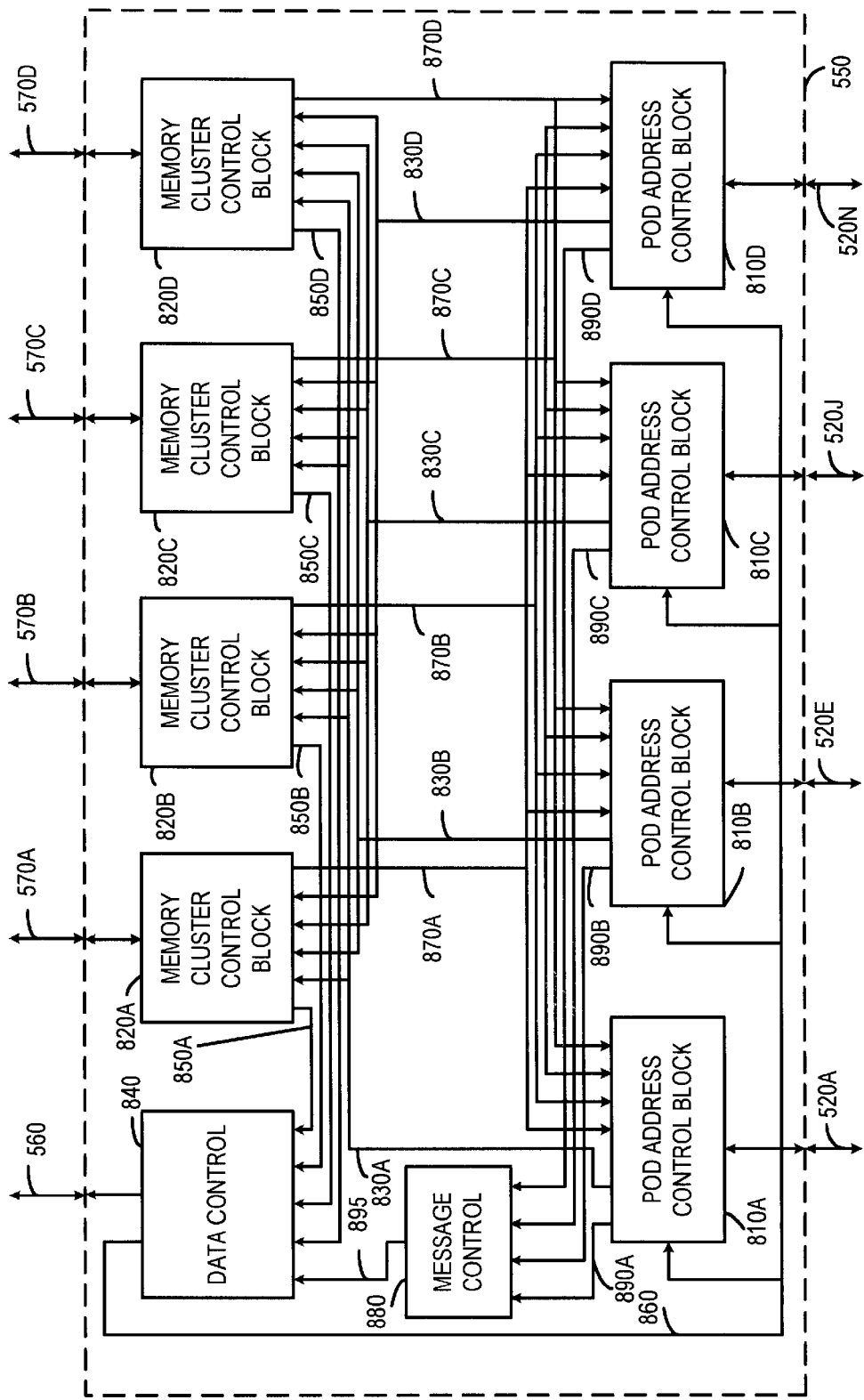
FIG. 8 is a block diagram of a Memory Controller (MCA) in the representative SMP.

FIG. 8 is a block diagram of the Memory Controller (MCA) 550. Although the following discussion specifically describes logic within MSU 110A, it is understood that this discussion applies equally to all MCAs included within all MSUs within Platform 100. The MCA 550 provides the control for data transfers occurring within the MDA 530. As discussed above, these transfers basically involve three types of operations: writing a cache line from a POD 120 to an MCL 535, reading a cache line from an MCL 535 to a POD 120, and transferring data (either message or Return data) from one POD 120 to another POD 120. MCA 550 controls each of these operations which are described in turn below.

A POD 120 writes a cache line to an MCL in three situations: during Flush, I/O Overwrite, and Return Operations. The MCA operation during a Return Operation is discussed below in association with the execution of Fetch operations, and the MCA operation during Flush and Overwrite operations is discussed as follows.

Flush operations occur when modified data is aged out of a POD's Second Level Cache 460 or Third Level Cache 410 and is written back to one of the MSUs 110. I/O Overwrite operations occur when the I/O is providing new data that is to replace whatever data currently is stored within a specified address within a MSU. In either instance, logic within the Crossbar Module 220 of the requesting one of the PODs 120A, 120B, 120C, and 120D determines which MSU 110 is mapped to a particular request address. As discussed above, each MSU is mapped to a predetermined range or range(s) of addresses within the entire range of the main memory address space.

The POD provides the address and associated command to the appropriate MSU 110 via respective ones of the Address/command Lines 520. For example, POD 120A provides an address and command over Address/command Lines 520A to POD Address Control Block 1010A, and so on. Address/command Lines 520 include bi-directional address signals, an output response signal, and various request, arbitrate and hold lines to control the flow of information to and from the respective one of the PODs 120. The address, command, and associated control information is stored within a respective one of the POD Address Control Blocks 810A, 810B, 810C, and 810D until it is selected as being associated with the next request to process.

When an address is selected as the next request address to process, it is provided to a selected one of the Memory Cluster Control Blocks 820A, 820B, 820C, and 820D via unidirectional address/control signals shown as Lines 830A, 830B, 830C, and 830D, respectively, based on the address. In a fully populated MSU, each of the Memory Cluster Control Blocks 820 handles one-fourth of the address range of the MSU. The selected Memory Cluster Control Blocks 820A, 820B, 820C, and 820D stores an address until it is selected for presentation to the associated MCL 535A, 535B, 535C, and 535D, respectively, across Address Lines 570A, 570B, 570C, and 570D, respectively. For example, addresses from Memory Cluster Control Block 820A are presented to MCL 535A across Address Lines 570A, and so on. Memory Cluster Control 820 selects an address for transfer to an MCL 535 based on which MSU Expansion 610 within the MCL 535 becomes available first to accept another request as will be discussed further below.

When a Memory Cluster Control Block 820 selects an address for transfer to one of the MCLs 535, the Memory Cluster Control Block makes a request to Data Control 840 on an associated Request Line 850 (shown as Request Lines 850A, 850B, 850C, and 850D). For example, prior to a transfer of an address from Memory Cluster Control Block 820A to MCL 535A, Memory Cluster Control Block makes a request on Line 850A to Data Control 840. In response, Data Control 840 provides the necessary control information on Line 560 to the POD Data Block 710 and MSU Data Block 720 participating in the transfer. During a Flush or I/O Overwrite operation, the appropriate one of the POD Data Blocks 710 is enabled to provide data to one of the MSU Data Blocks 720, which in turn is enabled to provide data to the associated one of the MCLs 535. This occurs as the address is provided by the associated one of the Memory Cluster Control Blocks 820 to the MCL.

Turning now to the operation of the MCA 550 during Fetch operations, Fetch operations are initiated in the same manner as described above. One of the PODs 120 provides the request address to the respective one of the POD Address Control Blocks 810, where the address is queued, and eventually transferred to the addressed Memory Cluster Control Block 820. When the address is selected as the next address to be presented to the associated MCL 535, the Memory Cluster Control Block 820 issues a request to the Data Control 840. Sometime after the request is made, the Data Control 840 provides the associated control to the MDA 530 on Line 560 to enable the appropriate MSU Data Block 720 to receive the cache line from the addressed MCL 535. The cache line is stored in a queues that resides in the MSU Data Block 720 prior to being provided to the corresponding POD Data Block 710.

In addition to the cache line, the MCL 535 also provides nine bits of directory state information from the addressed Directory Storage Arrays 630 to the MCA 550 over the respective one of Lines 570. Logic in the associated Memory Cluster Control Block uses the directory state information to determine if the cache line is present in the MSU 110, meaning that the MSU "owns" the latest copy of the cache line data. If the MSU does own the requested cache line, the MCA controls the transfer of the cache line from the MSU Data Block 720 to the POD Data Block 710 associated with the requesting POD, and further controls the subsequent transfer of the cache line to the requesting POD. As the data is being provided to the POD Data Block 710, Data Control 840 also provides control information on Line 860 which causes the appropriate POD Address Control Block 810 to issue the required response for the transfer. During a Fetch operation, the response is generated to the requesting POD when the first data transfer for a cache line is provided on lines 510. Part of the information in the response includes a "job number" used to associate the data with a particular request. The job number is necessary because a POD may have up to sixteen requests pending to main memory at any given time, and these requests may not necessarily be serviced in order. Therefore, the POD must be informed as to which outstanding request is associated with the returned data.

As discussed above, a POD may also initiate a Fetch operation for a cache line that the MSU does not own. If the directory state information retrieved from the Directory Storage Array 630 indicates another POD has exclusive ownership of that data, the MCA controls initiation of a Return Operation. This results in the retrieval of the latest copy of the cache line from the POD 120 that owns the data. In these cases, the MCA transfers the address associated with the requested cache line from the Memory Cluster Control Block 820 to the appropriate one of the POD Address Control Blocks 810A, 810B, 810C or 810D over the associated interface shown as Line 870A, 870B, 870C, or 870D, respectively. Since each Memory Cluster Control 820 operates independently, there is a separate address bus from each Memory Cluster Control Block to each POD Address Control Block 810 such that each POD Address Control Block can receive up to four address requests simultaneously. The POD Address Control Block stores the pending request addresses until they can be presented in a serial manner to the associated POD over bi-directional Address/command Lines 520 along with a Return function.

When an address and an associated Return function are presented to a POD 120 over the associated Address/command Lines 520, the address is forwarded to the cache (either the Third Level Cache 410 or a Second Level Cache 460) that stores the current copy of the data in a manner which is beyond the scope of this invention. After any in-progress operations are completed on the requested cache line, it is returned to the MSU 110 on the associated one of Data Lines 510. Up to four return functions may be initiated from an MSU simultaneously. Furthermore, multiple return functions may be outstanding to the PODs at any given instant in time. The PODs need not respond to these return functions in the order in which the functions were issued.

When a POD 120 returns a cache line in response to a return function, it is stored within a Write Data Queues (see Write Data Queue 1060 of FIG. 10) within the POD Data Block 710 for that POD. Data Control 840 generates control signals on Line 560 to cause the cache line to be transferred via the respective one of Lines 750 to the POD Data Block 710 associated with the requesting POD 120. In addition, the MCA 550 controls the transfer of the cache line from the POD Data Block 710 which is associated with the previous owner to the appropriate MSU Data Block 720 associated with the cache line address, and finally to the addressed MCL 535 so that the MSU has the latest copy of the data. The Memory Cluster Control Block 820 associated with the addressed MCL 535 generates updated directory state information which reflects the new access status of the data. This updated directory state information is written back to the Directory Storage Array 630 in the addressed MCL over Lines 570 as controlled by signals on Control Line 560.

In another instance, a POD may initiate a Fetch operation for a cache line that the MSU does not own, but that is resident in a shared access state in one or more other caches. In this case, the MSU has the most recent copy of the data since data held under shared access may not be modified. The MSU may therefore provide the data to the requesting POD in the manner discussed above. In addition, if the Fetch operation requested exclusive access status, a Purge function must be issued to the POD(s) having the shared local copies, thereby causing these POD(s) to invalidate their local copy.

In addition to controlling transfers of cache line data, the MCA 550 also controls the POD-to-POD transfers of message data. Within the MCA, message routing information is passed from the POD Address Control Block 810 to the Message Control 880 on the respective one of Lines 890 (shown as Lines 890A, 890B, 890C, and 890D) where this routing information is stored in a FIFO queue structure (not shown). The routing information for the message at the front of the FIFO is made available to the Data Control 840 on control lines shown collectively as Line 895. When Data Control 840 selects the message for transfer, Data Control generates control signals on Line 560 which are driven to the MDA 530. The control signals enable the transfer of message data from one of the Write Data Queues of a first (sending) POD Data Block 710 to input Data Select Logic (not shown) of another (receiving) POD Data Block on the appropriate interface represented by one of Lines 750. This message data is then routed to the associated POD 120 on Data Lines 510. The Data Control 840 also generates control signals on Line 860 to the POD Address Control Blocks 810 associated with the POD receiving the message data. This causes one of the POD Address Control Blocks to send a response to the receiving POD indicating that message data is available. Message Control 880 then generates control signals on line 890 to the POD Address Control Blocks 810 associated with the POD sending the message data. Up to four messages may be routed simultaneously within the MDA 530, and message routing may occur in parallel with receiving data from, and/or transferring data to, ones of the PODs, and receiving data from, and/or transferring data to, ones of the MCLs 535. This causes a respective one of the POD Address Control Blocks to send a response to the sending POD indicating that the message data has been transferred.

As can be appreciated, testing and initialization of a multiprocessing system having multiple data transfer paths and multiple memory banks such as the SMP 100 described above can be quite complex. Due to the magnitude of the memory itself, testing and initialization can be time-consuming. Further, because all data transfer paths should be properly tested, these pre-processing functions can consume even more time. It is therefore important to provide an efficient, yet thorough, testing and initialization implementation for such systems.

The present invention provides a system and method for efficiently testing and initializing memory, and is particularly useful for systems employing a very large storage array capable of being partitioned into multiple logical memory banks. Testing in accordance with the present invention involves highly parallel test activities that tests data storage, directory storage, and address and data interfaces. Multiple modes of testing are available to provide testing flexibility, and to account for potential system errors affecting even the initialization procedure. While the principles of the present invention are particularly useful in connection with large-scale systems such as the SMP 100, the invention is also useful in smaller systems employing multiple processing devices and multiple memory banks.

To initialize and test a system such as the SMP system 100 described above, an initialization sequence is performed to perform certain system initialization functions, followed by a memory and interface testing phase, and finally a configuration initialization. Essentially, the system initialization performs functions such as specific power on sequencing. The testing phase includes both testing of the memory and interface, and initialization of the storage, including certain address translation registers, directory storage, and data storage. After initialization, the address translation registers contains information reflecting the memory partitioning arrangement, and the directory storage is set to predetermined states, e.g., MSU ownership default, proper error correction code information (ECC), etc. In one embodiment, the data storage will contain an incrementing data pattern with correct ECC check bit information resulting from the exerciser testing. Alternatively, the data storage may be cleared, or written to another desired state.

The overall initialization sequence is somewhat dependent on the type of memory technology implemented. In one embodiment, the memory comprises synchronous dynamic random access memory (SDRAM) technology in order to achieve certain performance goals. As a result, the initialization sequence of the SMP system 100 includes a specific power on sequence to both protect and prepare the SDRAM devices for operation.

Figure 9:
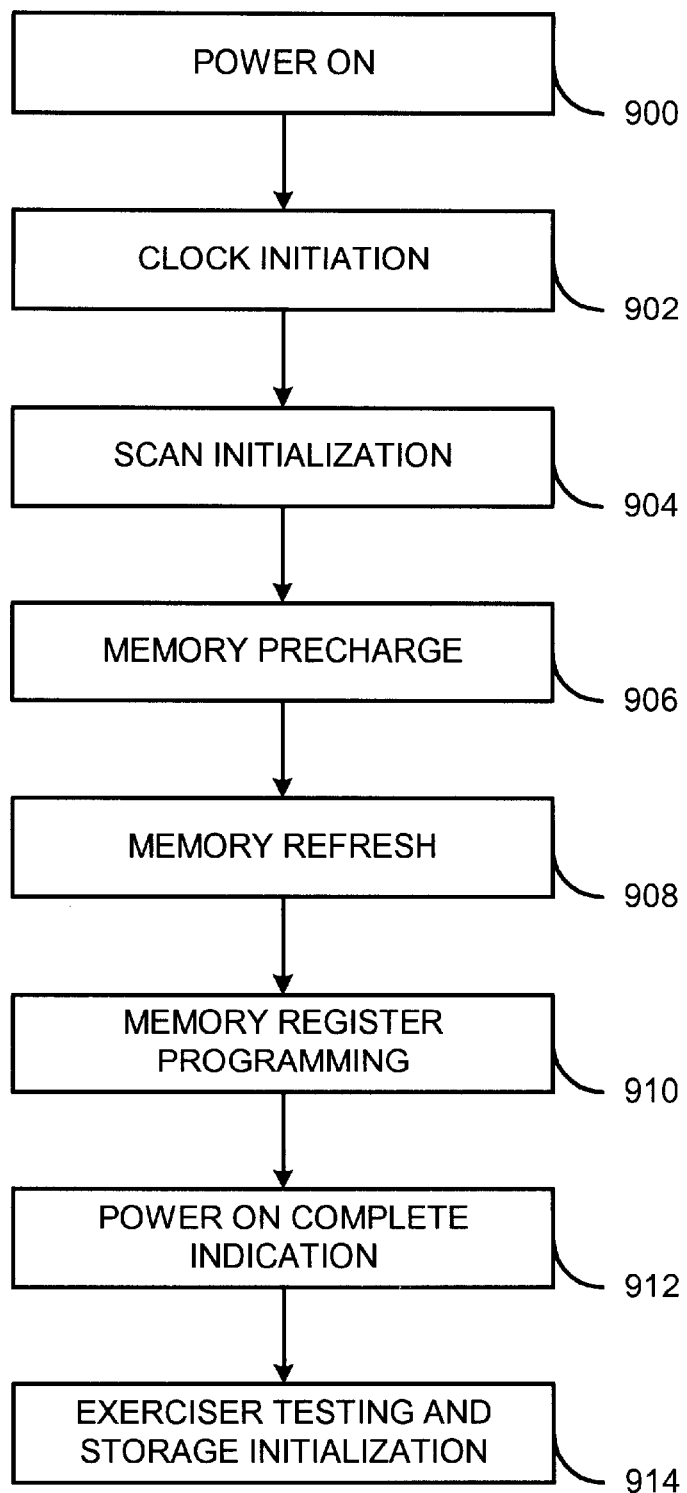
FIG. 9 is a flow diagram of one embodiment of a multiprocessing system initialization sequence that implements SDRAM memory devices in accordance with the present invention.

FIG. 9 is a flow diagram of one embodiment of a multiprocessing system initialization sequence that implements SDRAM memory devices in accordance with the present invention. A first stage 900 of the initialization includes a power on stage where power is applied to the system. This stage also places the SDRAMs in a state where the data outputs are prevented from turning on, thereby eliminating the possibility of having multiple drivers active on the SDRAM data bus. These data outputs will be held in this state throughout the power on sequencing period, and up to the power on complete stage 912 which is described below.

The clock initiation stage 902 is essentially an inherent idle time following power on. In one embodiment, at least 100 microseconds of idle time passes before clocks can be started and signal activity may begin. The scan initialization stage 904 allows certain latching devices in the hardware to be set to their respective specified initial states. In one embodiment, these latches are preset using scan operations conducted through a maintenance system. Generally, scan operations consider any digital circuit to be a collection of registers or flip-flops interconnected by combinatorial logic where information or test patterns can be shifted into a large shift register organized from the storage elements of the circuit. Many of these latches need to be "cleared" prior to their use, to ensure the proper state of the hardware upon initial use. Alternatively, some latches may be preset to a certain asserted state. For example, in the MCA 550, one particular latch marks the time period from scan to the power on complete stage 912, while another particular latch in the MCA 550 marks the time period from scan to the completion of the exerciser testing and storage initialization stage 914. One latch in the MDA 530 also marks the time period from scan to the completion of the exerciser testing and storage initialization stage 914, and is used by the exerciser logic in the MDA 530.

The memory precharge stage 906 is used to precharge the SDRAMs, which is required before they are used. All memory banks must be precharged before refresh or any other activity may begin. In one embodiment, this is accomplished by driving SDRAM signals CS (chip select), RAS (row address strobe), and WE (write enable) signals to a low logic level, and driving the CAS (column address strobe) signal and an address line (A10) to high logic levels. Following precharging, the initialization sequence moves on to perform a memory refresh 908. In this stage, each SDRAM device receives 8 CBR ("CAS Before RAS") refresh cycles before any further operations may continue. In one embodiment, refresh is accomplished by driving the CS, RAS, and CAS signals low, while driving the WE signal high on each of the SDRAM devices.

Once the memory has been precharged and has undergone initialization refresh cycles, each SDRAM device (including both directory and data storage) is programmed 910 via its mode registers. Such programming configures the SDRAM device in accordance with user-defined design rules. Programming the Mode Register of the SDRAMS is accomplished by driving the CS, RAS, CAS, and WE signals low, while driving address lines A0 through A11 to a coded value representative of the particular configuration desired. An example coded value for the data and directory SDRAMs is provided below in Tables 1A and 1B respectively:

TABLE 1A

DATA STORAGE

| A13 | A12 | A11 | A10 | A09 | A08 | A07 | A06 | A05 | A04 | A03 | A02 | A01 | A00 |
|---|---|---|---|---|---|---|---|---|---|---|---|---|---|
| | Res | | | Wr Brw | Res | Test No | CAS Latency 3 cycles | | | Md Intlv | Burst Length 4 words | | |
| 0 | 0 | 0 | 0 | 0 | 0 | 0 | 0 | 1 | 1 | 1 | 0 | 1 | 0 |

TABLE 1B

DIRECTORY STORAGE

| A13 | A12 | A11 | A10 | A09 | A08 | A07 | A06 | A05 | A04 | A03 | A02 | A01 | A00 |
|---|---|---|---|---|---|---|---|---|---|---|---|---|---|
| | Res | | | Wr Brw | Res | Test No | CAS Latency 3 cycles | | | Md Nint | Burst Length 1 word | | |
| 0 | 0 | 0 | 0 | 0 | 0 | 0 | 0 | 1 | 1 | 0 | 0 | 0 | 0 |

In these tables, "Wr" is the Write Mode, which in each case is "BRW" indicating burst read and burst write. "Test" indicates whether test mode is desired. The "CAS Latency" in each case is set to 3 cycles. Data storage configuration sets the addressing mode (Md) to interleaved, while directory storage configuration sets the addressing mode to reflect no interleaving (Nint). The burst length is set to 4 words for data storage configuration, while directory storage configuration is set to 1 word for burst length. "Res" indicates reserved locations.

Once programming has been completed, the power on complete stage 912 is reached. In this stage, the SDRAMs are removed from the state where the data outputs were prevented from turning on. To do this, a data mask signal that was asserted at the power on stage 900 is cleared. Also, a signal is asserted that indicates that the power on sequence is complete, which in turn allows the exerciser testing and storage initialization stage 914 to begin.

Generally, the exerciser logic tests and initializes all locations of the SDRAM data storage and directory storage arrays in each of the MCLs 535 (see FIG. 6). More particularly, each of the Data Storage Arrays 620 and Directory Storage Arrays 630 in each MCL 535 will be tested and initialized. The exerciser testing, which is described more fully below, provides for the generation of a continuous stream of addresses and associated write data patterns to the storage, and is also capable of verifying that the data patterns were properly written. This function both tests and initializes all locations of the Data Storage and the Directory Storage, and tests the address and data interfaces. In one embodiment of the invention, the exerciser test involves four passes throughout all of the memory, as described in Table 2 below:

TABLE 2

| | DATA STORAGE | DIRECTORY STORAGE | |
| --- | --- | --- | --- |
| | | READ PHASE | WRITE PHASE |
| PASS 1 | Write Data Pattern | Read; Ignore SBE/MUE | Write Pattern |
| PASS 2 | Read & Verify Pattern | Read & Verify Pattern | Write Complement |
| PASS 3 | Write Complement | Read & Verify Comp. | Write to 0s |
| PASS 4 | Read & Verify Comp. | Read & Verify 0s | Write to 0s |

In one embodiment, a 32-bit incrementing data pattern is used to test the Data Storage. The data pattern is written to the Data Storage during Pass 1. During Pass 2, this data pattern is read back and verified for accuracy. During Pass 3, the pattern is complemented, and read/verified in Pass 4. The incrementing data pattern is used in order to check address-unique connections between the MCA/MDA and the actual memory chips used. For example, if a particular address line were stuck at a low or high logic level, it may not be discovered where all address locations were written to one common logic level and then read back.

During normal operation, the Directory Storage normally performs a read-modify-write type of memory cycle. To test for this type of memory cycle, exerciser testing of the Directory Storage involves both a read phase and a write phase. During Pass 1 Read Phase, there may be single-bit-errors (SBE) or multiple-bit-errors (MUE) since the Directory Storage has not yet been written. SBEs and MUEs are blocked and ignored. During the Pass 1 Write Phase, a data pattern is written to the Storage Directory, which is incremented on each memory cycle. The pattern is read and verified during the Pass 2 Read Phase. The data pattern is complemented at the Pass 2 Write Phase, which is read and verified at the Pass 3 Read Phase. At the Pass 3 Write Phase, all Directory Storage locations are written to zero, while the correct check bit information (all ones) is also written to the Directory Storage. The Pass 4 Read Phase reads and verifies these values. The Pass 4 Write Phase then initializes the Directory Storage to its predetermined initialized state, which in one embodiment corresponds to all zeros.

Figure 10:
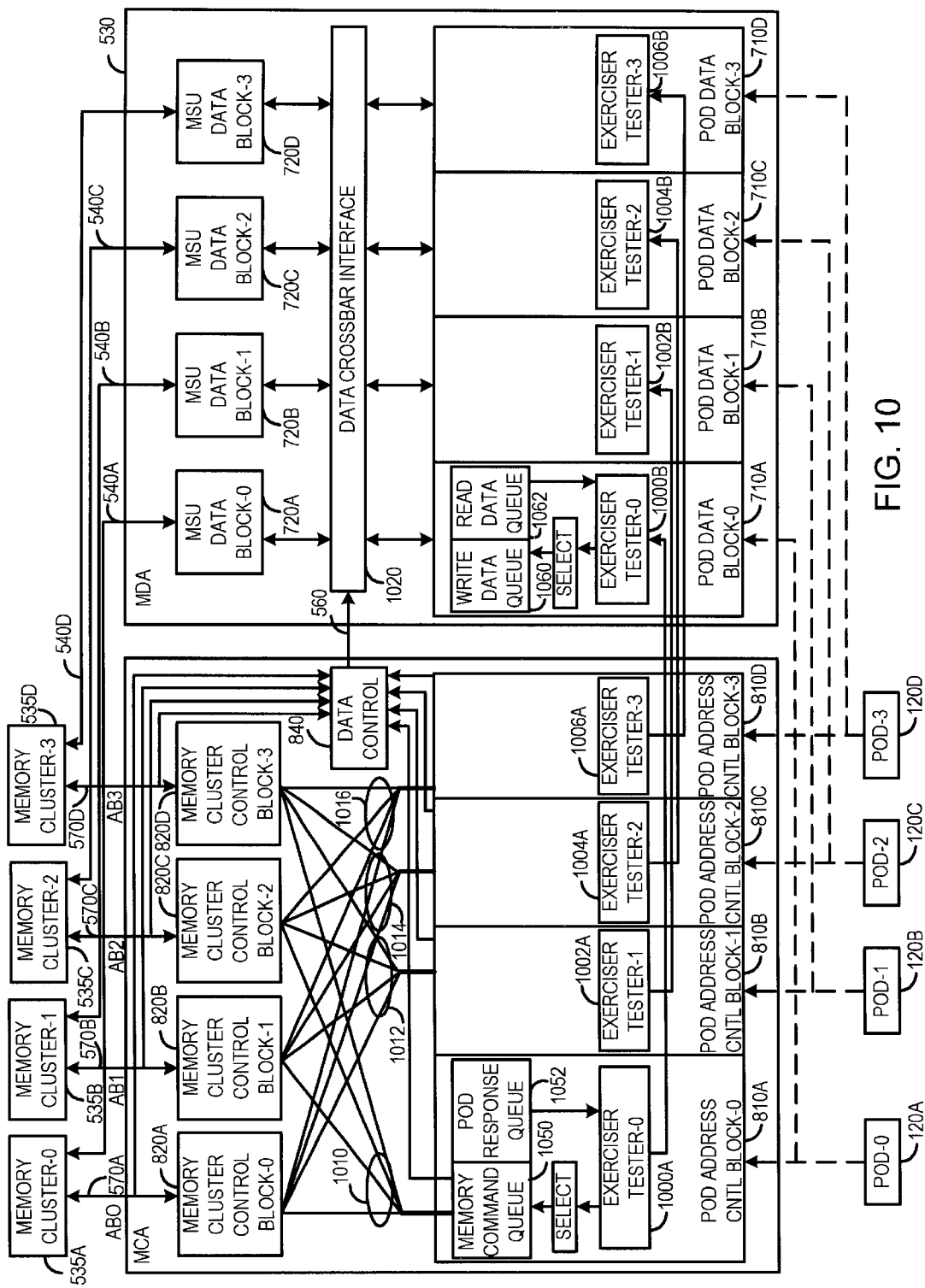
FIG. 10 which illustrates one embodiment of a data processing system incorporating the present invention.

Before describing the address pattern generation, attention is first drawn to FIG. 10 which illustrates one embodiment of a data processing system incorporating the present invention. The embodiment illustrated is selected to correlate to the SMP 100 system previously described. FIG. 10 therefore illustrates the major components in one MSU, such as MSU 110A of FIG. 2. Within the MSU is the MCA 550 and the MDA 530 which are coupled to its corresponding MSU memory illustrated as Memory Cluster-0 (MCL-0) 535A, MCL-1 535B, MCL-2 535C and MCL-3 535D. As previously described in connection with FIGS. 5 and 8, the MCLs 535A, 535B, 535C, 535D interface with the Memory Cluster Control Blocks 820A, 820B, 820C and 820D of the MCA 550 via Address/Command Lines 570A, 570B, 570C and 570D respectively. Similarly, as described in connection with FIGS. 5 and 7, the MCLs 535A, 535B, 535C, 535D interface with the MSU Data Blocks 720A, 720B, 720C and 720D of the MDA 530 via Data Buses 540A, 540B, 540C and 540D respectively.

In the SMP 100 system described above, multiple PODs are coupled to the MCA 550 and MDA 530. These PODs are shown in FIG. 10 as POD-0 120A, POD-1 120B, POD-2 120C, POD-3 120D. These PODs are coupled to the MCA 550 and MDA 530 for use during normal operation, but are not used during exerciser testing. Instead, a number of Exerciser Testers are used to generate the addresses and data test patterns to the Memory Clusters 535. Exerciser Tester-0 1000 includes Exerciser Tester-0 1000A within POD Address Control Block-0 810A and Exerciser Tester-0 1000B within POD Data Block-0 710A. Similarly, Exerciser Tester-1 1002 includes Exerciser Tester-1 1002A within POD Address Control Block-1 810B and Exerciser Tester-1 1002B within POD Data Block-1 710B, Exerciser Tester-2 1004 includes Exerciser Tester-2 1004A within POD Address Control Block-2 810C and Exerciser Tester-2 1004B within POD Data Block-2 710C, and Exerciser Tester-3 1006 includes Exerciser Tester-3 1006A within POD Address Control Block-3 810D and Exerciser Tester-3 1006B within POD Data Block-3 710D.

The Exerciser Tester associated with each of the POD Address Control Blocks 810A, 810B, 810C, 810D is used to drive test data to the memory across all interfaces, and then read and verify the pattern as described in Table 2 above. Each of the Exerciser Testers includes an address pattern generator and a data pattern generator, and each of the multiple Exerciser Testers is associated with a POD interface. As will be described more fully below, exerciser testing of each of the POD interfaces occurs in parallel to increase the speed and efficiency of the test.

The use of multiple Exerciser Testers facilitates testing of all potential interfaces. For example, referring to FIG. 10, Exerciser Tester-0 1000A provides addresses to each of the Memory Cluster Control Blocks 820A, 820B, 820C, 820D as indicated by interface lines 1010. Exerciser Tester-1 1002A provides addresses to each of the Memory Cluster Control Blocks on interface lines 1012, Exerciser Tester-2 1004A provides addresses to each of the Memory Cluster Control Blocks on interface lines 1014, and Exerciser Tester-3 1006A provides addresses to each of the Memory Cluster Control Blocks on interface lines 1016. Each Exerciser Tester is coupled to each of the Memory Cluster Control Blocks 820A, 820B, 820C, 820D to mimic the interfaces between the PODs 120A, 120B, 120C, 120D and the Memory Clusters 535A, 535B, 535C, 535D during normal operation, where an interleaved addressing scheme is employed. If a particular Exerciser Tester tested were only coupled to one of the Memory Cluster Control Blocks, then only four of the sixteen interfaces would be tested. The functionality of each of the individual interfaces on the sixteen interface lines 1010, 1012, 1014, 1016 are tested in accordance with the present invention, and allows each of the Exerciser Testers 1000, 1002, 1004, 1006 to test and initialize equal percentages of the memory, which in this case is a 25% portion of the memory. As will be described below, addresses are generated to realize this goal.

The configuration of the Exerciser Testers therefore allows testing of an addressing technique used during normal operation. This addressing technique is referred to as address interleaving. Interleaving allows utilization of memory resources to be spread across the memory by bit slicing cache lines or other data segments such that a portion of the data segment is stored in each of the Memory Clusters, thereby allowing parallel implementation and increasing performance. Since such an interleaving technique requires an interface between each POD Address Control Block 810 and each Memory Cluster Control Block 820, these individual interfaces must be tested. The present invention tests each of these interfaces by incrementing the memory address from each Exerciser Tester in such a way as to incrementally provide a test address to each of the Memory Cluster Control Blocks 820.

Because the write addresses increment in a predetermined manner, there must be a way to correlate the write address to the data returned when the memory under test is read so that the returned data can be compared to the proper known data pattern to conduct the verification test. In one embodiment of the invention, this is accomplished by using a strict addressing sequence to write the data test pattern, and using the same addressing sequence to read the returned data for verification. The addressing sequence according to a preferred embodiment of the invention is described more fully below.

Again referring to FIG. 10, each Exerciser Tester 1000 in the MCA 550 generates incrementing cache line addresses. Depending on the particular address, the Data Crossbar Interface 1020 will be notified as to which POD Data Block 710 and which MSU Data Block 720 should be connected. This notification is provided via Control Lines 560. For example, where Exerciser Tester-0 1000A in the MCA 550 provides an address to Memory Cluster Control Block-0 820A via one of the Interfaces 1010, the Data Crossbar Interface 1020 is notified that the data test pattern generated at Exerciser Tester-0 1000B in the MDA 530 is to be connected to MSU Data Block-0 720A to provide the data test pattern to Memory Cluster-0 535A. The Exerciser Tester-0 1000A also provides a data pattern increment signal on line 1022 to the MDA portion of the Exerciser Tester-0, which is Exerciser Tester-0 1000B. Therefore when the address is generated at Exerciser Tester-0 1000A, the Exerciser Tester-0 1000B produces a data test pattern that is provided to the Memory Cluster designated by the generated address.

It should be noted that in one embodiment of the invention, each Exerciser Tester in the MCA 550 is associated with a Memory Command Queue 1050 and a POD Response Queue 1052. The Memory Command Queue 1050 queues requests prior to output to the Memory Cluster Control Blocks 820, and the POD Response Queue 1052 queues data transfer responses back to the particular POD. Similarly, each Exerciser Tester in the MDA 530 is associated with one or more Write Data Queues 1060 and a Read Data Queue 1062. The Write Data Queue 1060 queues data to be provided to the MSU Data Blocks 720 via the Data Crossbar Interface 1020, and the Read Data Queue 1062 queues data provided back to a particular POD. Further, the control signals 560 are provided by the Data Control 840, which is coupled to each of the POD Address Control Blocks 810 and each of the Memory Cluster Control Blocks 820 as described in connection with FIG. 8. The management of data transfers using queuing structures in connection with the Data Control 840 may be determined in a manner described herein and in copending U.S. patent application entitled "High-Performance Modular Memory System With Crossbar Connections", filed Dec. 31, 1997, Ser. No. 09/001,592, which is assigned to the assignee of the instant application, the contents of which are incorporated herein by reference.

Figure 11:
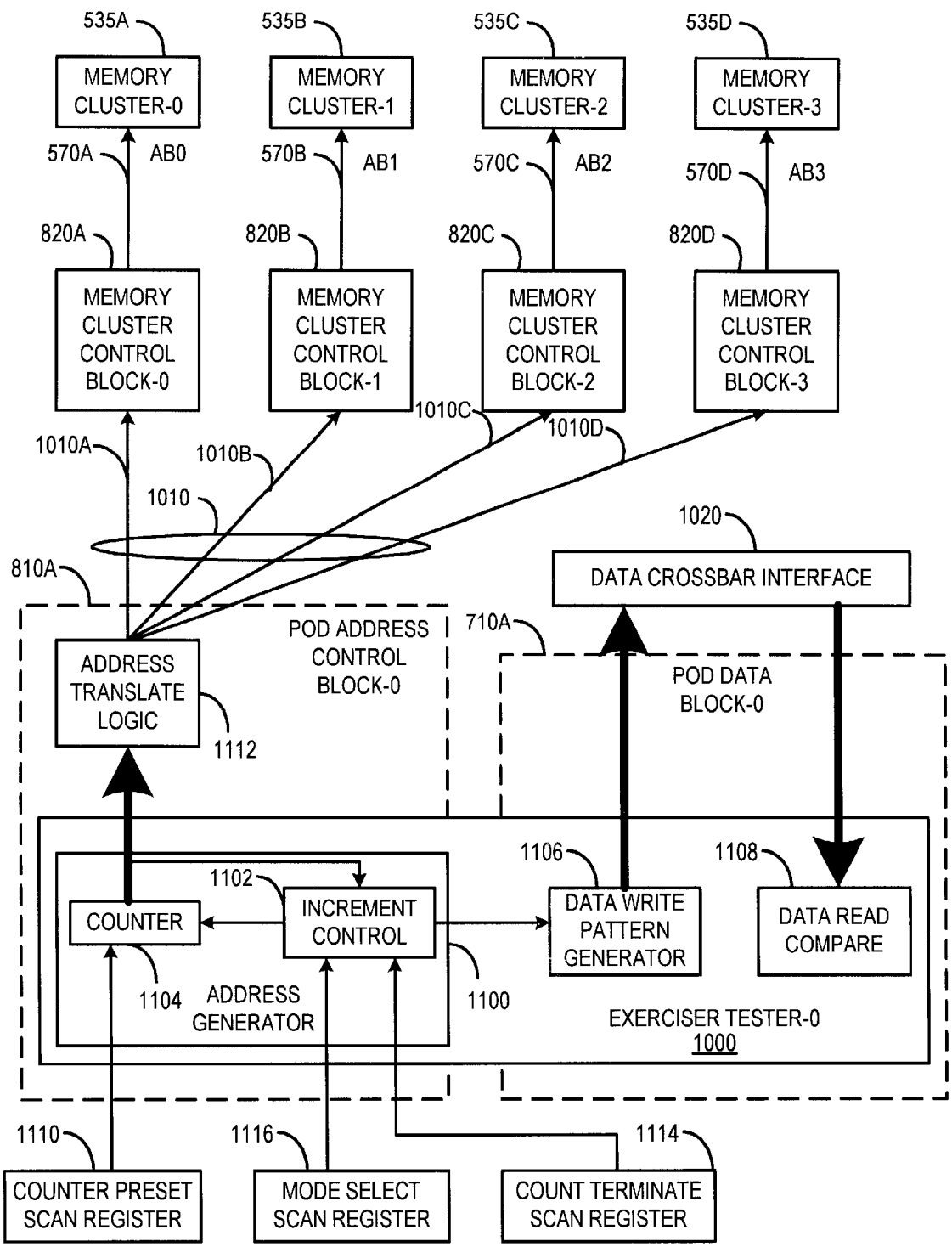
FIG. 11 illustrates one embodiment of an Exerciser Tester in accordance with the present invention.

FIG. 11 illustrates one embodiment of an Exerciser Tester in accordance with the present invention. For this example, Exerciser Tester-0 1000 is described, but each of the remaining Exerciser Testers 1002, 1004, 1006 operates analogously. In this embodiment, the Exerciser Tester-0 1000 includes circuitry associated with both the MCA 550 and the MDA 530, as portions of the circuitry reside in the POD Address Control Block-0 810A and the POD Data Block-0 710A. Within the POD Address Control Block-0 810A is an Address Generator 1100, which includes at least an Increment Control module 1102 and a Counter 1104. Within the POD Data Block-0 710A is a Data Write Pattern Generator 1106 and a Data Read Compare module 1108.

The Address Generator 1100 is responsible for generating the addresses to be output from the POD Address Control Block-0 810A. The addresses generated by each of the Exerciser Testers provides addresses to test one-fourth of the memory address range (its pro rata share as there are four Exerciser Testers), where this one-fourth of the memory address range is distributed throughout each of the Memory Clusters 535. In other words, the Address Generation circuit 1100 will provide addresses for every fourth cache line location in each of the Memory Clusters 535.

The addresses generated by the Address Generator 1100 are generated in an incrementing fashion. The Address Generator 1100 includes a Counter 1104 that is initialized via static scan methods during the Scan Initialization stage 904 (FIG. 9) to reflect its first count output value. A Counter Preset Scan Register 1110 is provided to accept the initialized count value. The value that is initially loaded into Counter 1104 is 0, which ultimately provides an address via Address Bus 0 (AB0) 570A to Memory Cluster-0 535A. The Counters associated with the other Exerciser Testers are preset to initially address different ones of the Memory Clusters. For example, in one embodiment, the Address Generator in Exerciser Tester-1 1002 is set to first address Memory Cluster-1 535B via Address Bus 1 (AB1) 570B, the Address Generator in Exerciser Tester-2 1004 is set to first address Memory Cluster-2 535C via Address Bus 2 (AB2) 570C, and the Address Generator in Exerciser Tester-3 1006 is set to first address Memory Cluster-3 535D via Address Bus 3 (AB3) 570D. This provides the initial address offset required to facilitate concurrent addressing of each of the Memory Clusters 535. The addressing scheme will be addressed more fully below.

The Counter 1104 provides an address count on a cache line basis. In other words, each increment by the Counter 1104 represents an increment of one cache line, which in one embodiment is 64 bytes of information. Each address count generated by the Counter 1104 is provided to the Address Translate Logic 1112 where the address count is converted to a memory address capable of addressing the desired cache line. The Address Translate Logic performs a translation function on the address count based on an address translation pattern stored in a general register array. This translation function re-maps the incoming address count provided by the Counter 1104 to different areas of actual memory to allow for memory bank interleaving, expanded memory capacity, and memory sharing capabilities. Address translation may be determined in a manner described herein and in copending U.S. patent application entitled "Programmable Address Translation System", filed Dec. 31, 1997, Ser. No. 09/001,390, which is assigned to the assignee of the instant application, the contents of which are incorporated herein by reference.

The Counter 1104 is controlled by the Increment Control circuit 1102. The Increment Control provides a signal to the Counter 1104 to cause the Counter 1104 to increment. The Increment Control 1102 causes the Counter to increment by either 5 cache lines or 1 cache line, depending on the state of the two least significant bits of the cache line address count.

FIG. 12 illustrates the variable incrementation function of the Increment Control. The Address column 1200 shows the two least significant bits of the cache line address count, including 00, 01, 10 and 11. Where the cache line address count is 00, the desired cache line is associated with Memory Cluster-0 535A, and therefore the targeted bus is Address Bus 0 (AB0) 570A, as indicated in the Targeted Bus column 1202. In this case, the Increment Control 1102 notifies the Counter 1104 to increment by 5 cache lines, as indicated in the Increment column 1204. This incrementation by 5 causes the next Counter 1104 value to have a 01 for the two least significant bits (e.g., 00$\underline{00}$+0101=010$\overline{1}$; 01 $\overline{00}$+0101=100$\overline{1}$; etc.). This causes the next cache line address count to be directed to a different target bus. In the example of FIG. 12, incrementing the cache line address count of 00 by 5 causes the next cache line address count to have a 01 for the two least significant bits, which is associated with a Targeted Bus of AB1. Another increment by 5 addresses AB2, and another increment of 5 addresses AB3. In this manner, four consecutive cache line address counts from a particular Counter 1104 targets each of the four Memory Clusters 535A, 535B, 535C, 535D.

Incrementing the cache line address counts by 1 would also cause the a rotation from Targeted Bus AB0 to AB1 to AB2 to AB3. However, this would result in the generation of consecutive cache line addresses from each of the Exerciser Testers. In order to provide address interleaving, where each Exerciser Tester tests the entire memory range but every fourth cache line, the cache line address must be incremented by 5. However, a wrap-around condition is required such that when the two least significant bits are 11, the Increment Control 1102 only increments by 1 cache line address count as indicated in FIG. 12. This address increment pattern is implemented by each of the Exerciser Testers 1000, 1002, 1004, 1006 to provide interleaved addressing of the entire memory range while testing each of the individual interfaces.

FIG. 13 illustrates the cache line address pattern generated by the Increment Control and Counter in each of the Exerciser Testers. Looking first at the Exerciser Tester-0 column 1300, the cache line address count initially preset by the Counter Preset Scan Register 1110 is address zero (i.e., 0000 0000). It should be noted that for purposes of this example, only the eight least significant bits are reproduced for each address. Address 0000 0000 targets Address Bus AB0. Because the two least significant bits are 00, the Increment Control 1102 increments by 5, as was described in connection with FIG. 12. This increment by 5 results in a subsequent Exerciser Tester-0 address of 0000 0101, which targets AB1. Another increment by 5 results in address 0000 1010, which targets AB2, and another increment by 5 results in address 0000 1111, which targets AB3. When this address is reached, the increment is then by 1, making the next address to be output from Exerciser Tester-0 to be 0001 0000, which again targets AB0. This cycle continues, and as can be seen in the "BUS" column of Exerciser Tester-0 column 1300, the targeted address bus repeatedly cycles through each of the target buses associated with the four Memory Clusters (i.e., AB0, AB1, AB2, AB3, AB0, etc.).

The addresses generated by Exerciser Tester-0 are interleaved with the addressed generated by the other Exerciser Testers. For example, the Exerciser Tester-1 column 1302 indicates that the cache line address count initially preset by its corresponding Counter Preset Scan Register is address one (i.e., 0000 0001). Address 0000 0001 targets Address Bus AB1. Because the two least significant bits are 01, the Increment Control 1102 increments by 5, as was described in connection with FIG. 12. This increment by 5 results in a subsequent Exerciser Tester-1 address of 0000 0110, which targets AB2. Another increment by 5 results in address 0000 1011, which targets AB3. Because the two least significant bits are 11, the next increment is 1, making the next address to be output from Exerciser Tester-1 to be 0000 1100, which targets AB0. This cycle continues, and as can be seen in the "BUS" column of Exerciser Tester-1 column 1302, the targeted address bus repeatedly cycles through each of the target buses associated with the four Memory Clusters (i.e., AB1, AB2, AB3, AB0, AB1, etc.), but targets a different address bus than the address bus targeted by the Exerciser Tester-0. This results in interleaved addresses for the addresses generated by Exerciser Tester-0 and Exerciser Tester-1.

Exerciser Tester-2 and Exerciser Tester-3 operate analogously. However, the cache line address count for Exerciser Tester-2 is initially preset by its corresponding Counter Preset Scan Register is address two (i.e., 0000 0010) and therefore initially targets Address Bus AB2 as indicated by Exerciser Tester-2 column 1304. The cache line address count for Exerciser Tester-3 is initially preset by its corresponding Counter Preset Scan Register is address three (i.e., 0000 0011) and therefore initially targets Address Bus AB3 as indicated by Exerciser Tester-3 column 1306. The generated address pattern is therefore the same for each Exerciser Tester, however they are each initialized with a different address to provide the desired address interleaving.

Figure 14:
FIG. 14 illustrates the cache line address pattern as viewed by the Address Buses.

This addressing scheme is further exemplified in FIG. 14, which illustrates the cache line addresses as viewed by the Address Buses. AB0 column 1400 illustrates that it receives addresses from each of the Exerciser Testers 0, 1, 2, 3 in a repeating, cycled manner (e.g., from Exerciser Tester-0, Exerciser Tester-3, Exerciser Tester-2, Exerciser Tester-1, Exerciser Tester-0, etc.). The "ADDRESS" shown in columns 1400, 1402, 1404, 1406 represent the cache line address output from each Counter in its associated Exerciser Tester, and does not represent the actual address provided to the Memory Cluster coupled to the particular address bus. The Address Translation Logic in each of the POD Address Control Blocks provides the correct memory address from the cache line address received. For example, looking to AB0 column 1400, the first cache line storage location in Memory Cluster-0 535A will receive a cache line having an address count of 0000 0000 from Exerciser Tester-0 1000. The second cache line storage location in Memory Cluster-0 535A will receive a cache line having an address count of 0000 0100 from Exerciser Tester-3 1006. The Memory Cluster is therefore filled by each consecutive cache line received from its corresponding Address Bus.

Attention is again directed to FIG. 11. The Address Generators in the Exerciser Testers may generate a predetermined number of addresses where the total memory to be tested is known. However, in one embodiment of the invention, the number of MSU Expansions 610 (see FIG. 6) is user-specified. Therefore, the Address Generators may not know at the time of address generation whether there is physical memory behind the address generated. The Address Generators generate the addresses, and the Address Translate Logic 1112 informs the associated Address Generator when a particular address is invalid. The Memory Cluster Control Blocks 820A, 820B, 820C, 820D never see an invalid address. The upper limit of the physical memory can be configured prior to testing, so that the Increment Control 1102 knows when to stop causing the Counter 1104 to provide cache line addresses. A static scan register, labeled Count Terminate Scan Register 1114, is provided in each Exerciser Tester to receive a value corresponding to this count termination point. When the desired amount of storage has been exercised, no further exerciser test commands will be issued. This can be used to increase the speed of initialization, and also prevents the Exerciser Testers from addressing unpopulated storage.

The Increment Control circuit 1102 also provides an increment signal to the Data Write Pattern Generator 1106 in its associated POD Data Block, which in FIG. 11 is POD Data Block-0 710A. Each time the Increment Control 1102 notifies the Counter 1104 to output a cache line address count, the Increment Control 1102 also provides an increment signal to the Data Write Pattern Generator 1106 to increment its data pattern. As previously described, an incrementing data pattern produces a multitude of various patterns, which provides for better test coverage. This data pattern is provided to the Data Crossbar Interface 1020, and on to the appropriate Memory Cluster Control Block.

During the read/verification stage of the test procedure, the data patterns written to the Memory Clusters are read back into the POD Data Blocks using the same addressing scheme used to write the data patterns to memory. This is essential in order to properly correlate the returned data with its expected value. The Data Read Compare circuit 1108 performs this comparison, and logs errors when the returned data does not correspond to its expected value.

In another embodiment of the invention, the Increment Control 1102 is capable of multiple mode operation. A first mode (Mode 1) corresponds to the description provided above, where each Exerciser Tester is operational, and the incrementation is designed to allow address interleaving. This was accomplished by incrementing in accordance with FIG. 12. However, incrementation can be forced to always increment the cache line address by 1 (rather than by 5, 5, 5, 1). This is desirable in situations where any of the four POD Address Control Blocks are unavailable for initialization. For example, if it were believed that a particular POD Address Control Block was not functional, it could not be used to produce a successful initialization sequence. A second mode (Mode 2) is therefore provided, that allows one of the available POD Address Control Blocks to conduct the entire exerciser test. Selection between these modes is again accomplished using a static scan register, labeled Mode Select Scan Register 1116, which is loaded during the Scan Initialization stage 904 described in connection with FIG. 9. When testing under Mode 2, the exerciser test will take four times longer to conduct, since the parallel testing cannot be accomplished as in Mode 1. Under Mode 2, in order for the active Exerciser Tester to produce requests in the sequence specified in FIG. 14, adjustment of the two least significant bits of the cache line address count is required.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. A memory test and initialization circuit for testing and initializing a memory and memory interfaces in a data processing system wherein the memory is logically partitioned into a plurality of memory banks, comprising:
    (a) a plurality of exerciser testers, one for each of the plurality of memory banks, each of the plurality of exerciser testers comprising:
        (i) an address generator to generate a sequence of memory bank addresses to successively address each of the memory banks in a cyclic manner, wherein each of the address generators concurrently addresses a different one of the memory banks;
        (ii) a data pattern generator coupled to a corresponding one of the address generators to receive a data pattern control signal upon an output of each of the memory bank addresses generated by its corresponding one of the address generators, and to output a unique data pattern to the memory bank identified by the memory bank address in response to each occurrence of the data pattern control signal; and
    (b) a plurality of address initialization registers, one for each of the plurality of exerciser testers, wherein each of the plurality of address initialization registers stores an initial one of the memory bank addresses for one of the memory banks such that each of the address generators is preset to initially address a different one of the memory banks.

2. The memory test and initialization circuit as in claim 1, wherein each memory bank comprises a plurality of data storage locations, and wherein each of the memory bank addresses targeted for a particular one of the memory banks successively addresses each of the data storage locations.

3. The memory test and initialization circuit as in claim 1, wherein the address generators further generate the sequence of memory bank addresses to read the unique data patterns from the plurality of memory banks, and wherein the memory test and initialization circuit further comprises a data compare circuit to receive the unique data patterns read from the plurality of memory banks for comparison to expected data patterns for each of the memory bank addresses.

4. The memory test and initialization circuit as in claim 1, wherein the address generator comprises a counter to generate a data segment count value, wherein each data segment count value corresponds to a different data storage location in the memory banks for storing the unique data patterns.

5. The memory test and initialization circuit as in claim 4, further comprising an address translation circuit coupled to each of the address generators to translate the data segment count value to corresponding ones of the memory bank addresses.

6. The memory test and initialization circuit as in claim 5, further comprising an increment control circuit coupled to the counter to provide an incrementation signal to the counter to control an increment of the data segment count value.

7. The memory test and initialization circuit as in claim 6, wherein the increment control circuit is further coupled to the data pattern generator to generate the data pattern control signals, and wherein the data pattern increments in response to the data pattern control signal such that the data pattern increments upon each output of the memory bank address generated by its corresponding one of the address generators.

8. The memory test and initialization circuit as in claim 6, wherein the increment control circuit generates the incrementation signal in accordance with a predetermined incrementation pattern which causes the memory bank addresses to successively address each of the memory banks in a cyclic manner.

9. The memory test and initialization circuit as in claim 8, wherein the predetermined incrementation pattern comprises incrementing the data segment count value by (N+1) for (N−1) consecutive increments followed by incrementing the data segment count value by 1, and wherein the predetermined incrementation pattern is repeated.

10. The memory test and initialization circuit as in claim 9, further comprising a count terminate register to store a termination count corresponding to a total number of incrementations desired, and wherein the predetermined incrementation pattern is repeated until the termination count is reached.

11. The memory test and initialization circuit as in claim 1, wherein each of the address generation circuits comprises an increment control circuit to provide an incrementation signal to control an increment of the memory bank addresses.

12. The memory test and initialization circuit as in claim 11, further comprising a mode select register to store a mode select value, wherein each of the mode select values select one of a plurality of predetermined incrementation patterns to represent the incrementation signal.

13. The memory test and initialization circuit as in claim 12, wherein a first mode select value causes the memory bank addresses to successively address each of the memory banks in a cyclic manner, and wherein the predetermined incrementation pattern cyclically causes the data segment count value to be incremented by (N+1) for (N−1) consecutive increments followed by incrementing the data segment count value by 1.

14. The memory test and initialization circuit as in claim 12, wherein a second mode select value sets the predetermined incrementation pattern to 1 to cause the memory bank addresses generated by one of the address generators to successively address each of the memory banks in a cyclic manner, and wherein remaining ones of the plurality of exerciser testers are inactive.

15. A method for performing test and initialization of a memory having a plurality of memory banks, comprising:
concurrently generating a plurality of memory bank addresses from a plurality of address generators, wherein each of the concurrently generated memory bank addresses targets a different one of the plurality of memory banks;
providing the memory bank addresses from each particular one of the address generators to each of the plurality of memory banks in a cyclical fashion;
generating an incrementing data pattern for each of the memory bank addresses targeting a particular one of the memory banks, wherein each of the data patterns is written to the memory bank addressed by its corresponding memory bank address;
reading the data patterns from the plurality of memory banks in the same sequence in which the data patterns were written to the plurality of memory banks; and
comparing the data patterns read from the plurality of memory banks to expected data patterns to verify memory and memory interface performance.

16. The method of claim 15, further comprising partitioning the memory into a plurality of logical memory units representing the plurality of memory banks.

17. The method of claim 15, wherein concurrently generating the plurality of memory bank addresses comprises:
generating a plurality of cache line count values; and
translating each of the plurality of cache line count values into the memory bank addresses.

18. The method of claim 17, wherein generating a plurality of cache line count values comprises incrementing a counter in accordance with a predetermined incrementation pattern which causes each of the address generators to successively address each of the memory banks in a cyclical fashion.

19. The method of claim 18, wherein the predetermined incrementation pattern comprises incrementing the data segment count value by (N+1) for (N−1) consecutive increments followed by incrementing the data segment count value by 1, and wherein the predetermined incrementation pattern is repeated.

20. The method of claim 15, further comprising presetting the memory bank addresses from each particular one of the address generators to a predetermined memory bank address prior to generating the memory bank addresses, wherein each of the address generators is preset to initially target a different one of the plurality of memory banks.

21. The method of claim 15, wherein generating an incrementing data pattern for each of the memory bank addresses comprises generating a final data pattern to be provided to each of the memory banks upon completion of the generation of the incrementing data patterns, wherein the final data pattern corresponds to a desired initialized state of the memory banks.

22. A method for performing test and initialization of an SDRAM memory having a plurality of SDRAM memory banks, comprising:
(a) initializing hardware registers to a predetermined logic state;
(b) precharging each of the SDRAM memory banks;
(c) performing a memory refresh operation on each of the SDRAM memory banks;
(d) programming each of the SDRAM memory banks to conform to a desired mode of operation;
(e) performing an exerciser test of each of the SDRAM memory banks, comprising:
(i) concurrently generating a plurality of memory bank addresses from a plurality of address generators, wherein each of the concurrently generated memory bank addresses targets a different one of the plurality of memory banks;
(ii) providing the memory bank addresses from each particular one of the address generators to each of the plurality of memory banks in a cyclical fashion;
(iii) generating an incrementing data pattern for each of the memory bank addresses targeting a particular one of the memory banks, wherein each of the data patterns is written to the memory bank addressed by its corresponding memory bank address;
(iv) reading the data patterns from the plurality of memory banks in the same sequence in which the data patterns were written to the plurality of memory banks; and
(v) comparing the data patterns read from the plurality of memory banks to expected data patterns to verify memory and memory interface performance.

23. A memory test and initialization circuit for testing and initializing a memory and memory interfaces in a data processing system wherein the memory is logically partitioned into a plurality of memory banks, comprising:
(a) a plurality of exerciser test means, one for each of the plurality of memory banks, each of the plurality of exerciser test means comprising:
(i) address generation means for generating a sequence of memory bank addresses to successively address each of the memory banks in a cyclic manner, wherein each of the address generation means concurrently addresses a different one of the memory banks;
(ii) data pattern generation means coupled to a corresponding one of the address generation means for receiving a data pattern control signal upon an output of each of the memory bank addresses generated by its corresponding one of the address generation means, and for outputting a unique data pattern to the memory bank identified by the memory bank address in response to each occurrence of the data pattern control signal; and (b) address initialization means for storing an initial one of the memory bank addresses for one of the memory banks such that each of the address generation means is preset to initially address a different one of the memory banks.

24. The memory test and initialization circuit as in claim 23, wherein the address generation means comprises cache line count means for generating a cache line count, wherein each cache line count corresponds to a different data storage location in the memory banks for storing the unique data patterns.

25. The memory test and initialization circuit as in claim 24, further comprising address translation means coupled to each of the address generation means for translating the cache line count into corresponding ones of the memory bank addresses.

26. The memory test and initialization circuit as in claim 25, further comprising increment control means coupled to the cache line count means for providing an incrementation signal to the cache line count means to control an increment of the cache line count.

27. The memory test and initialization circuit as in claim 26, wherein the increment control means comprises means for generating the incrementation signal in accordance with a predetermined incrementation pattern which causes the memory bank addresses generated by each of the address generation means to successively address each of the memory banks in a cyclic manner.

* * * * *